US011640841B2

United States Patent
Ghosh et al.

(10) Patent No.: US 11,640,841 B2
(45) Date of Patent: May 2, 2023

(54) MEMORY SYSTEMS INCLUDING MEMORY ARRAYS EMPLOYING COLUMN READ CIRCUITS TO CONTROL FLOATING OF COLUMN READ BIT LINES, AND RELATED METHODS

(71) Applicant: Microsoft Technology Licensing, LLC, Redmond, WA (US)

(72) Inventors: Amlan Ghosh, Mebane, NC (US); Sung Hao Lin, Apex, NC (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 17/364,487

(22) Filed: Jun. 30, 2021

(65) Prior Publication Data

US 2023/0005527 A1    Jan. 5, 2023

(51) Int. Cl.
*G11C 11/419* (2006.01)
*G11C 11/412* (2006.01)

(52) U.S. Cl.
CPC .......... *G11C 11/419* (2013.01); *G11C 11/412* (2013.01)

(58) Field of Classification Search
CPC .............. G11C 11/5692; G11C 11/416; G11C 11/4091; G11C 11/4085; G11C 11/419; G11C 11/412; G11C 8/08; G11C 7/12; G11C 7/1048
USPC ........................................................ 365/154
See application file for complete search history.

(56) References Cited

U.S. PATENT DOCUMENTS

| 5,754,485 | A | 5/1998 | Miura | |
|---|---|---|---|---|
| 5,828,610 | A * | 10/1998 | Rogers | G11C 7/1072 365/230.02 |
| 7,684,274 | B2 * | 3/2010 | Rengarajan | G11C 7/02 365/207 |
| 2008/0151668 | A1 * | 6/2008 | Kobayashi | G11C 11/4097 365/207 |
| 2008/0175084 | A1 * | 7/2008 | Akiyama | H01L 27/10897 365/208 |
| 2009/0251980 | A1 * | 10/2009 | Takami | G11C 7/067 365/205 |

(Continued)

OTHER PUBLICATIONS

"International Search Report and Written Opinion Issued in PCT Application No. PCT/US2022/030148", dated Sep. 16, 2022, 11 Pages. (MS#410204-WO-PCT).

*Primary Examiner* — Sung Il Cho
(74) *Attorney, Agent, or Firm* — Withrow & Terranova, PLLC

(57) ABSTRACT

A memory system includes a column circuit to generate a logic state of data stored in one of the memory bit cell circuits in a column in a read operation. The column circuit includes a read control circuit to cause a float control circuit to couple a read bit line to a charged evaluation output line in a read operation and cause the float control circuit to decouple the read bit line from the evaluation output line in an idle stage. Decoupling the read bit line from the charged evaluation output line reduces power lost between read operations by current leaking through read port circuits in the memory bit cell circuits to which the read bit line is coupled. The memory system may include at least one read bit line, each coupled to a respective float control circuit and a respective plurality of memory bit cell circuits in a column.

17 Claims, 10 Drawing Sheets

(56) References Cited

U.S. PATENT DOCUMENTS

2010/0259972 A1\* 10/2010 Sakai ..................... H01L 27/11
                                                        365/191
2011/0305099 A1   12/2011 Sharma et al.
2012/0230130 A1\*  9/2012 Sheppard ............. G11C 11/418
                                                        365/189.011

\* cited by examiner

MEMORY SYSTEMS INCLUDING MEMORY ARRAYS EMPLOYING COLUMN READ CIRCUITS TO CONTROL FLOATING OF COLUMN READ BIT LINES, AND RELATED METHODS

FIELD OF THE DISCLOSURE

The technology of the disclosure relates in general to memory arrays, and in particular to circuits for controlling read lines in columns of memory bit cell circuits in a memory array.

BACKGROUND

Integrated circuits (ICs) make it possible for electronic devices to perform a wide variety of applications with high speed and accuracy. ICs may include one or more processing circuits that execute application instructions and quickly process information. The instructions and other information may be stored in memory arrays of a memory system. The information stored in memory arrays also includes data that is used by, and may be generated by, the instructions. Examples of such data include photographs, video games, data bases and application user data.

To accommodate the large amount of data stored in an IC, memory arrays may occupy a significant percentage of the area of an IC. Memory arrays may also consume a significant percentage of the power consumed by the IC. Power consumption in an IC generates heat and can reduce battery life in mobile devices. Memory arrays may consume power at a higher rate when addressed memory bit cell circuits are being accessed to read or write information during instruction processing. Memory arrays may also be powered when not being accessed in an inactive mode when they are not being accessed for data retention. There may be leakage current that causes the memory arrays to consume power in the inactive mode. Therefore, the manufacturers of ICs seek ways to reduce power consumption by reducing leakage current in memory arrays during active and inactive modes.

SUMMARY

Exemplary aspects disclosed herein include memory systems including memory arrays employing column read circuits to control floating of column read bit lines. Related methods of performing a read operation in a memory array employing column read circuits to control floating of column read bit lines are also disclosed. The memory system includes one or more bit cell columns each including a plurality of memory bit cells (e.g., static random-access memory (SRAM) bit cells) that each store a logic state. The logic state stored in a selected one of the memory bit cells can control a read port circuit in the memory bit cell to determine a logic state generated onto a read bit line. The read port circuit includes a read port output and the read port outputs of multiple memory bit cells in the same column are coupled to the read bit line. The memory system includes a column read circuit to evaluate the logic state on the read port output of the selected memory bit cell. The column read circuit includes an evaluation output line coupled to the read port circuits by the read bit line in a dynamic read circuit structure. The column read circuit also includes a pre-charge circuit that is activated to pre-charge the evaluation output line in an idle stage and in a pre-charge stage of a read operation. The column read circuit includes a float control circuit coupled inline between the evaluation output line and the read bit line. The memory system includes a read control circuit to control activation and deactivation of the float control circuit. While the evaluation output line is pre-charged by the pre-charge circuit in the idle stage between read operations, the float control circuit is deactivated to isolate the evaluation output line from the read bit line and the read port circuits. In other words, the read bit line and the read port outputs of the read port circuits are kept floating in the idle stage so the pre-charge circuit only pre-charges the evaluation output line, which reduces power consumption caused by leakage current through the read port circuits. Because there are a plurality of memory bit cells in a column and each includes a read port circuit, the power loss due to leakage would be much higher if the evaluation output line is coupled to the read bit line in the idle stage. In the pre-charge stage of the read operation, prior to an evaluation stage of the read operation, the float control circuit is activated to couple the evaluation output line to the read bit line and the read port circuits to briefly pre-charge the dynamic read circuit for evaluation. Due to a voltage drop across the float control circuit, the read bit line and the read port outputs are pulled up to a voltage lower than the power supply voltage, which saves power and reduces charging time. The pre-charge circuit is deactivated in the evaluation stage of the read operation and the read port circuit of the selected memory bit cell is activated to provide an evaluation of the stored logic state to the evaluation output line. A read word line (RWL) coupled to the selected memory bit cell activates the read port circuit in the evaluation stage and the stored logic state controls the read port circuit to indicate the stored logic state on the evaluation output line. The read port circuit can be two stacked transistors controlled by the RWL and the stored logic state, respectively, to pre-charge or discharge the read bit line based on the logic state stored in the memory bit cell. After the read operation, the float control circuit is deactivated in the idle stage.

Performance of the memory system in a memory read operation may be improved by reducing a number of memory bit cells to which the read bit line is coupled in a column. In this manner, both the length of the read bit line and the number of capacitive loads may be reduced. For this reason, the memory bit cells in each column may be divided among a plurality of (e.g., two or more) read bit lines and each read bit line is coupled to the evaluation output line through a corresponding float control circuit. Since only one memory bit cell in a column may be read in a read operation, only the float control circuit of the read bit line coupled to the selected memory bit cell is activated, while all the other float control circuits remain deactivated to reduce power loss.

In exemplary aspects disclosed herein a memory system is disclosed. The memory system comprises at least one bit cell column circuit each comprising a plurality of memory bit cell circuits, a read bit line coupled to a first plurality of memory bit cell circuits of the plurality of memory bit cell circuits in a bit cell column circuit among the at least one bit cell column circuit, and a column read circuit. The column read circuit comprises an evaluation output line, a pre-charge circuit configured to pre-charge the evaluation output line in an idle stage and in a pre-charge stage of a read operation, and a float control circuit coupled between the read bit line and the evaluation output line. The float control circuit is configured to couple the read bit line to the evaluation output line in the pre-charge stage and in an evaluation stage of the read operation, and decouple the read bit line from the evaluation output line in the idle stage. The column read circuit is configured to evaluate a stored logic state of a selected one of the first plurality of memory bit cell circuits on the evaluation output line in the evaluation stage. The at least one bit cell column circuit also includes a read control circuit coupled to the float control circuit, the read control circuit configured to cause the float control circuit to couple the evaluation output line to the read bit line in response to the pre-charge stage and in response to the evaluation stage of the read operation, and cause the float control circuit to decouple the evaluation output line from the read bit line in response to the idle stage.

In another exemplary aspect, a memory system comprises at least one bit cell column circuit each comprising a plurality of memory bit cell circuits, a read bit line coupled to a first plurality of memory bit cell circuits of the plurality of memory bit cell circuits in a bit cell column circuit among the at least one bit cell column circuit, and a column read circuit. The column read circuit comprises an evaluation output line, a pre-charge circuit configured to pre-charge the evaluation output line in an idle stage and in a pre-charge stage of a read operation, and a float control circuit coupled between the read bit line and the evaluation output line. The float control circuit is configured to couple the read bit line to the evaluation output line in the pre-charge stage and an evaluation stage of the read operation, and decouple the read bit line from the evaluation output line in an idle stage. The column read circuit also includes a column output circuit coupled to the evaluation output line, the column output circuit configured to generate a column output signal based on a evaluation output signal, the column output circuit comprising an inverter circuit configured to generate the column output signal comprising a logic state complementary to a logic state of the evaluation output line. The column read circuit is configured to evaluate a stored logic state of a selected one of the first plurality of memory bit cell circuits on the evaluation output line in the evaluation stage.

In another exemplary aspect, a method of a read operation in a memory system is disclosed. The method comprises receiving, in a read control circuit in a bit cell column circuit in a memory system, an indication indicating one of an idle stage, a pre-charge stage of a read operation, and an evaluation stage of the read operation to read a logic state of data stored in a memory bit cell circuit of a plurality of memory bit cell circuits in the bit cell column circuit, the bit cell column circuit further comprising an evaluation output line, a float control circuit, and a first read bit line coupled to a read port circuit in each of a first plurality of memory bit cell circuits of the plurality of memory bit cell circuits in the bit cell column circuit. The method includes controlling, by the read control circuit, a pre-charge circuit to couple the evaluation output line to a supply voltage rail to charge the evaluation output line to a first pre-charged state in response to the indication indicating the idle stage, the first pre-charged state corresponding to a first voltage, couple the evaluation output line to the supply voltage rail to charge the evaluation output line to the first pre-charged state in response to the indication indicating the pre-charge stage of the read operation, and decouple the evaluation output line from the supply voltage rail in response to the indication indicating the evaluation stage of the read operation. The method further includes controlling, by the read control circuit, the float control circuit to couple the first read bit line to the evaluation output line in response to the indication indicating the pre-charge stage of the read operation, couple the first read bit line to the evaluation output line in response to the indication indicating the evaluation stage of the read operation, and decouple the first read bit line from the evaluation output line in response to the indication indicat-ing the idle stage. The method further includes coupling, by the read port circuit in a selected one of the first plurality of memory bit cell circuits, the first read bit line to a ground voltage rail to discharge the evaluation output line to a discharged state based on a first logic state of data stored in the selected one of the first plurality of memory bit cell circuits; decoupling, by the read port circuit in one of the first plurality of memory bit cell circuits, the first read bit line from the ground voltage rail to keep the evaluation output line in the first pre-charged state based on a second logic state of the data stored in the one of the first plurality of memory bit cell circuits; and generating, in a column output circuit in response to the indication of the evaluation stage of the read operation, a column output signal in a first output logic state based on the evaluation output line comprising the first pre-charged state and in a second output logic state based on the evaluation output line comprising the discharged state.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

FIG. 1 is a schematic diagram of a memory array circuit including a bit cell column circuits including a plurality of memory bit cell circuits, each bit cell column circuit including a column read circuit configured to generate a column output signal indicating a logic state stored in one of the memory bit cell circuits in a read operation;

FIG. 2 is a schematic diagram illustrating features of a bit cell column circuit in a conventional memory array circuit including a column read circuit coupled to a first read bit line coupled to a read port circuit of a memory bit cell circuit in a first plurality of memory bit cell circuits and a second read bit line coupled to a read port circuit of a memory bit cell circuit in a second plurality of memory bit cell circuits;

Figure 4A:
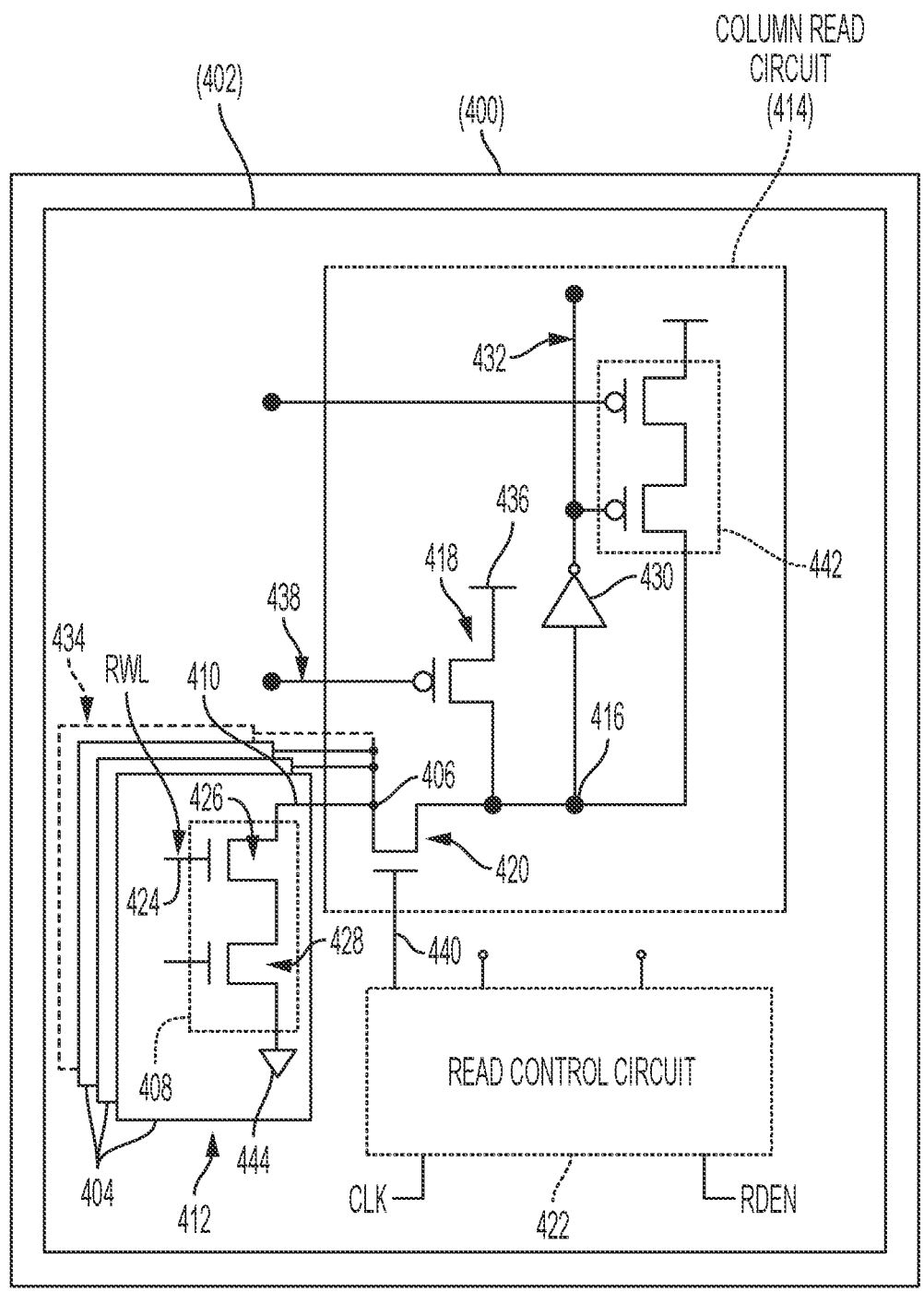
FIG. 4A is a schematic diagram illustrating an exemplary memory system including features of a bit cell column circuit including a read control circuit configured to selectively couple a first read bit line to a column read circuit in a read operation to one of a first plurality of memory bit cell circuits.
Figure 4B:
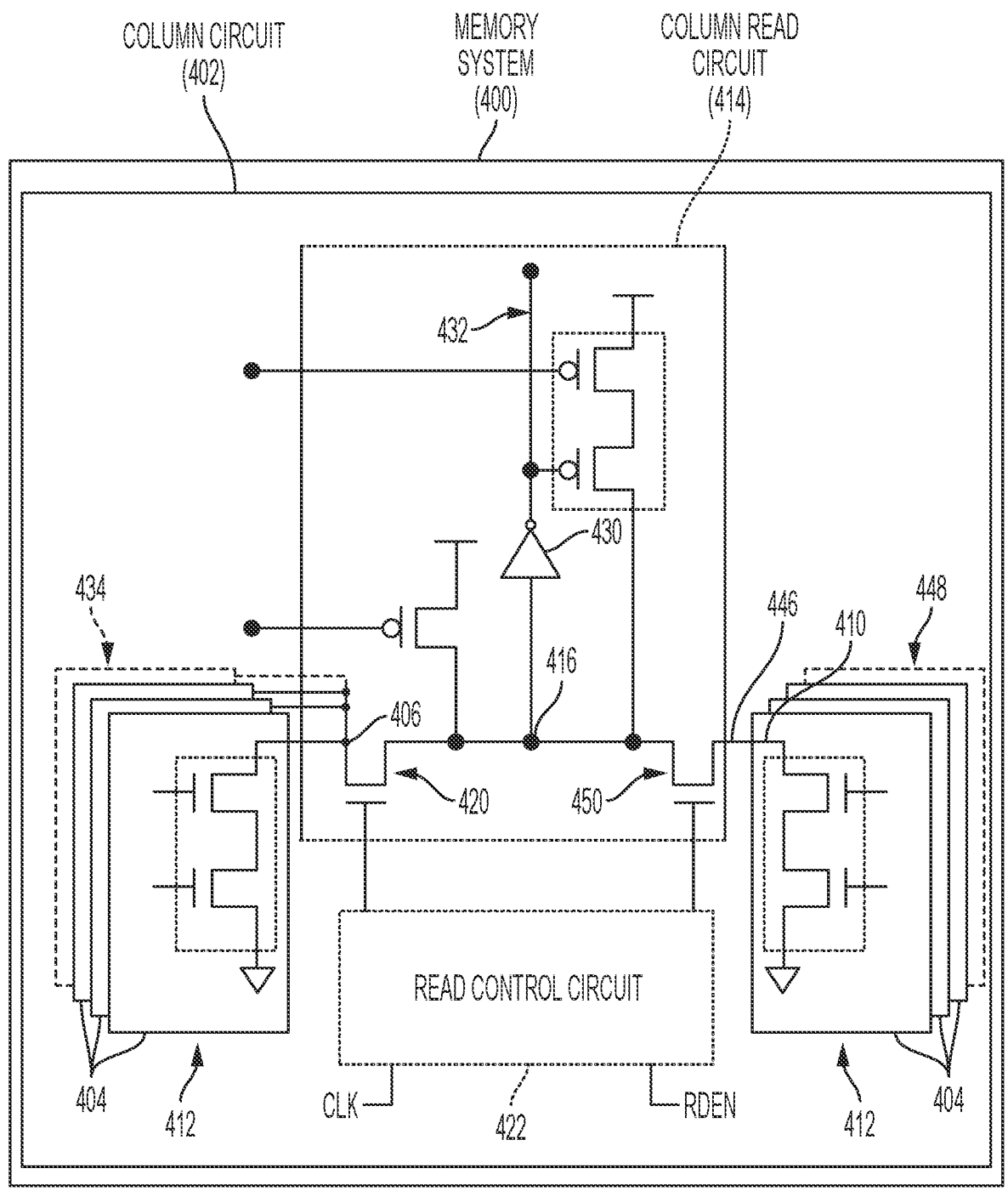
FIG. 4B is a schematic diagram illustrating the exemplary memory system in FIG. 4A including a bit cell column circuit including a read control circuit configured to selectively couple one of the first read bit line and a second read bit line to the column read circuit in a read operation depending on a read address.
Figure 6:
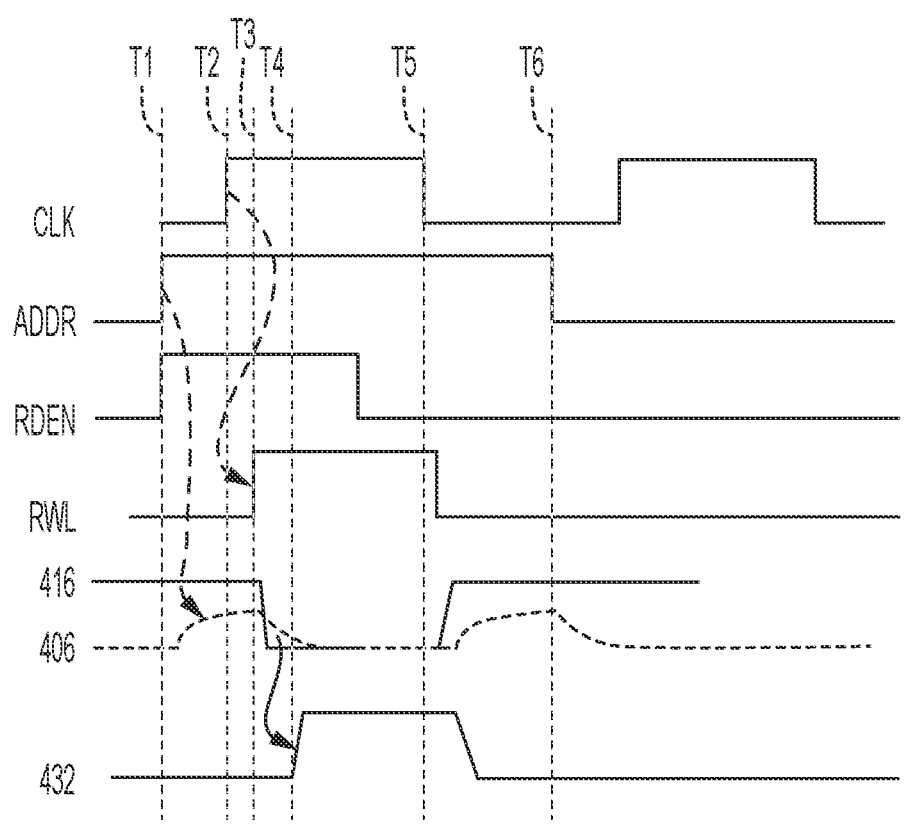
Figure 7:
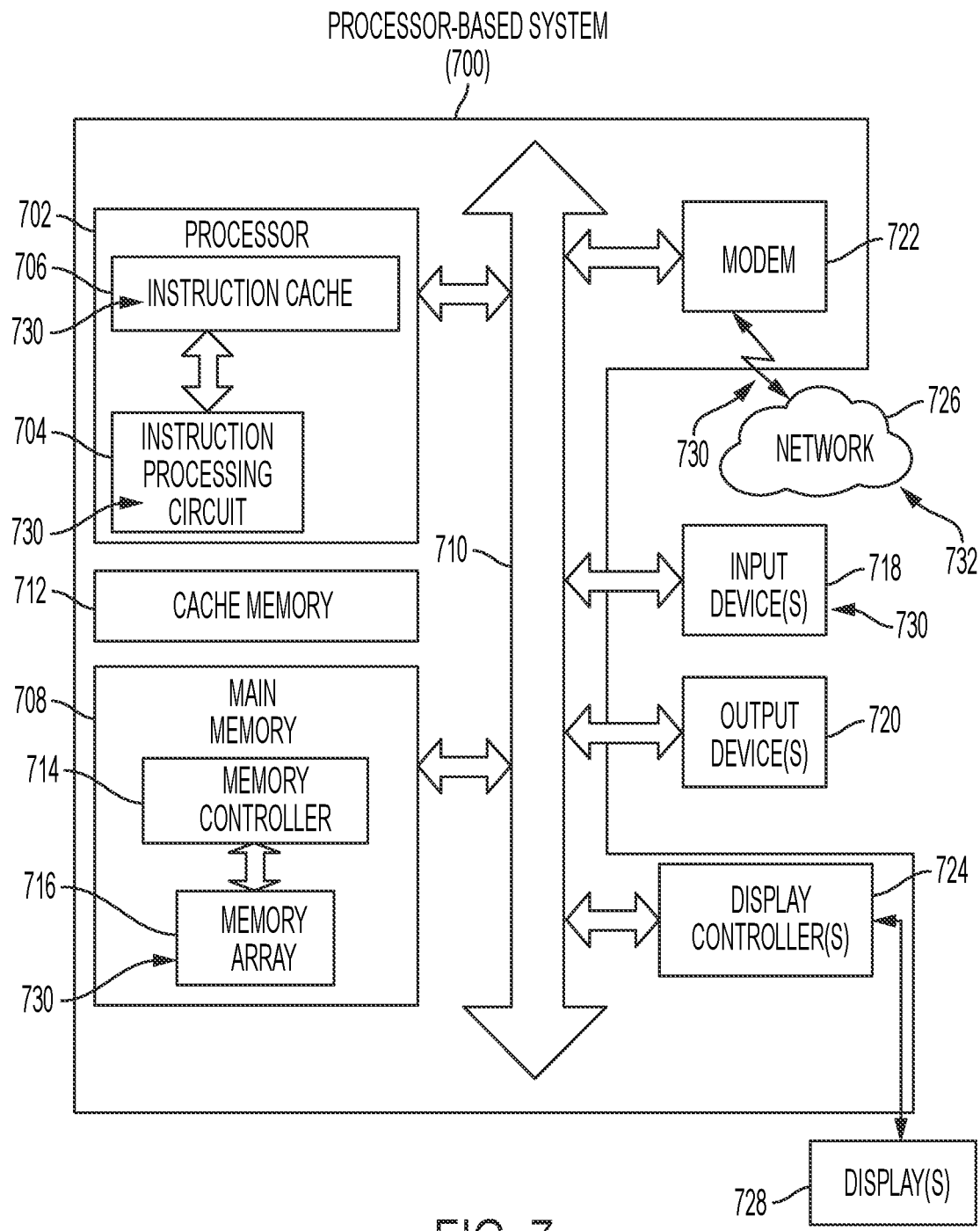

FIG. 6 is a timing diagram illustrating control and data signals internal to the exemplary memory array circuit of FIG. 4A in a read operation; and FIG. 7 is block diagram of an exemplary processor-based system including a plurality of devices coupled to a system bus, wherein the processor-based system includes a memory array system including features of a bit cell column circuit including a read control circuit configured to selectively couple a first read bit line to a column read circuit in a read operation to one of a first plurality of memory bit cell circuits, as illustrated in FIGS. 4A and 4B.

DETAILED DESCRIPTION

Exemplary aspects disclosed herein include memory systems including memory arrays employing column read circuits to control floating of column read bit lines. Related methods of performing a read operation in a memory array employing column read circuits to control floating of column read bit lines are also disclosed. The memory system includes one or more bit cell columns each including a plurality of memory bit cells (e.g., static random-access memory (SRAM) bit cells) that each store a logic state. The logic state stored in a selected one of the memory bit cells can control a read port circuit in the memory bit cell to determine a logic state generated onto a read bit line. The read port circuit includes a read port output and the read port outputs of multiple memory bit cells in the same column are coupled to the read bit line. The memory system includes a column read circuit to evaluate the logic state on the read port output of the selected memory bit cell. The column read circuit includes an evaluation output line coupled to the read port circuits by the read bit line in a dynamic read circuit structure. The column read circuit also includes a pre-charge circuit that is activated to pre-charge the evaluation output line in an idle stage and in a pre-charge stage of a read operation. The column read circuit includes a float control circuit coupled inline between the evaluation output line and the read bit line. The memory system includes a read control circuit to control activation and deactivation of the float control circuit. While the evaluation output line is pre-charged by the pre-charge circuit in the idle stage between read operations, the float control circuit is deactivated to isolate the evaluation output line from the read bit line and the read port circuits. In other words, the read bit line and the read port outputs of the read port circuits are kept floating in the idle stage so the pre-charge circuit only pre-charges the evaluation output line, which reduces power consumption caused by leakage current through the read port circuits. Because there are a plurality of memory bit cells in a column and each includes a read port circuit, the power loss due to leakage would be much higher if the evaluation output line is coupled to the read bit line in the idle stage. In the pre-charge stage of the read operation, prior to an evaluation stage of the read operation, the float control circuit is activated to couple the evaluation output line to the read bit line and the read port circuits to briefly pre-charge the dynamic read circuit for evaluation. Due to a voltage drop across the float control circuit, the read bit line and the read port outputs are pulled up to a voltage lower than the power supply voltage, which saves power and reduces charging time. The pre-charge circuit is deactivated in the evaluation stage of the read operation and the read port circuit of the selected memory bit cell is activated to provide an evaluation of the stored logic state to the evaluation output line. A read word line (RWL) coupled to the selected memory bit cell activates the read port circuit in the evaluation stage and the stored logic state controls the read port circuit to indicate the stored logic state on the evaluation output line. The read port circuit can be two stacked transistors controlled by the RWL and the stored logic state, respectively, to pre-charge or discharge the read bit line based on the logic state stored in the memory bit cell. After the read operation, the float control circuit is deactivated in the idle stage.

Performance of the memory system in a memory read operation may be improved by reducing a number of memory bit cells to which the read bit line is coupled in a column. In this manner, both the length of the read bit line and the number of capacitive loads may be reduced. For this reason, the memory bit cells in each column may be divided among a plurality of (e.g., two or more) read bit lines and each read bit line is coupled to the evaluation output line through a corresponding float control circuit. Since only one memory bit cell in a column may be read in a read operation, only the float control circuit of the read bit line coupled to the selected memory bit cell is activated, while all the other float control circuits remain deactivated to reduce power loss.

Figure 1:
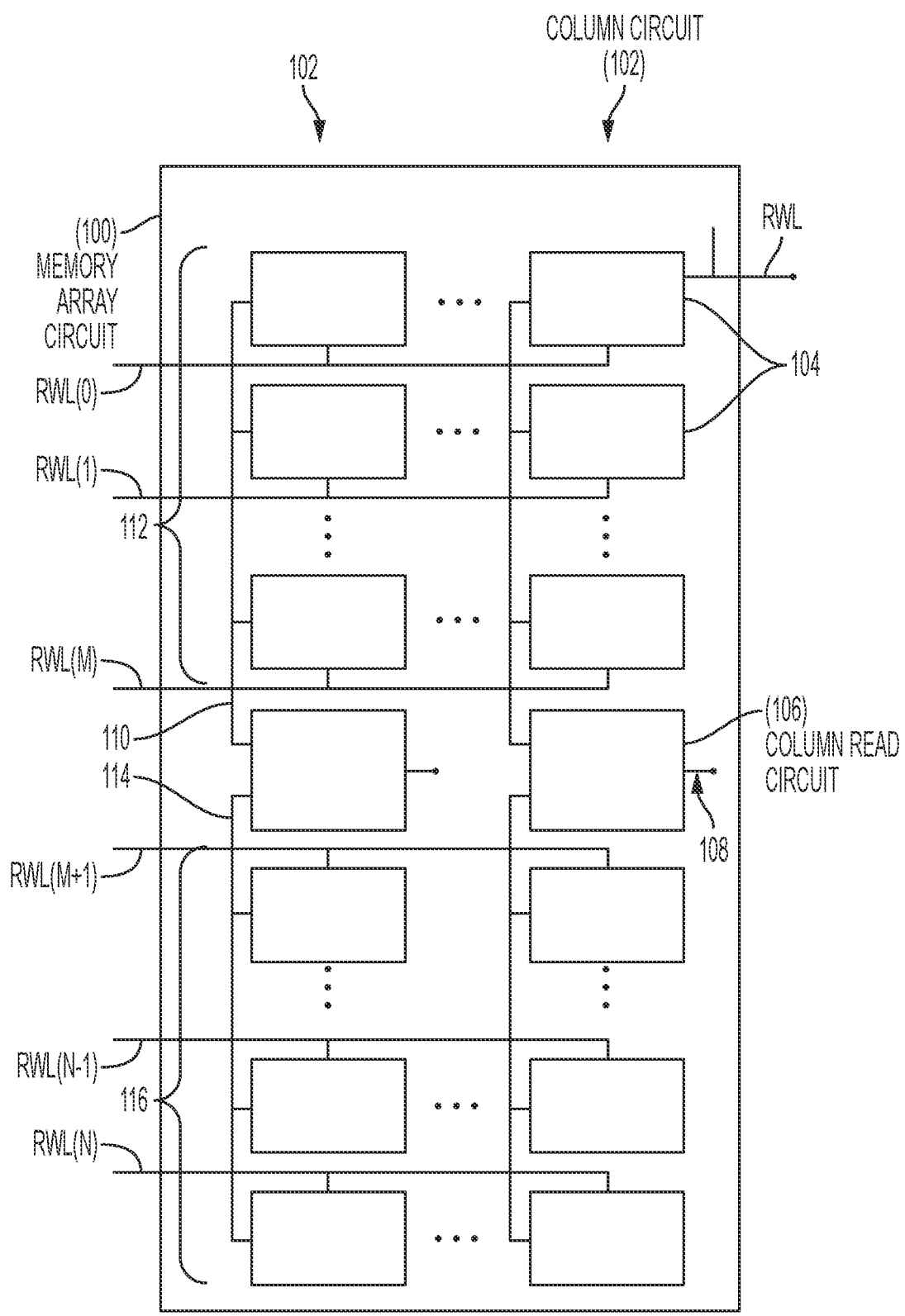
Figure 2:
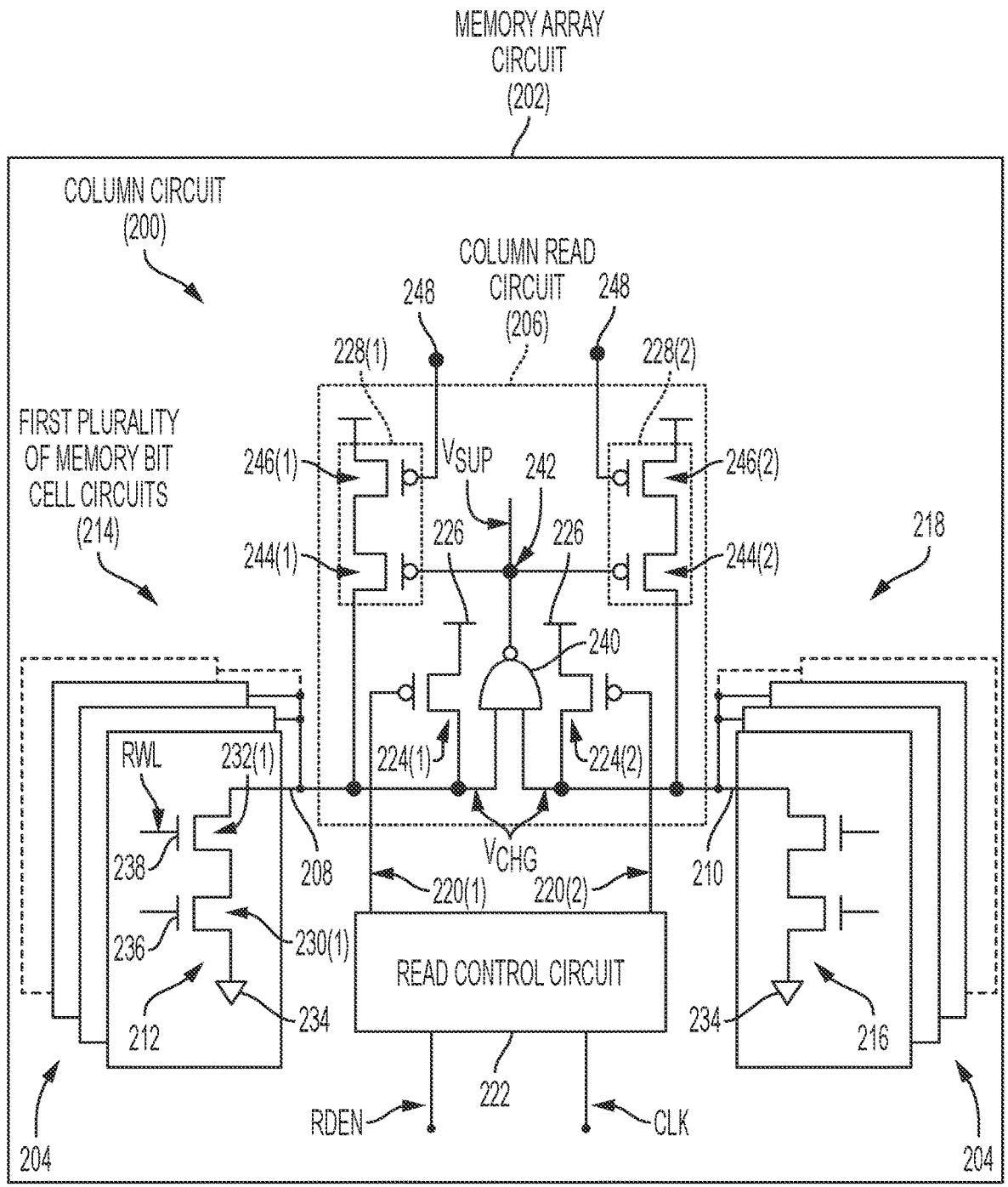

FIG. 1 is a schematic diagram of a memory array circuit 100 including bit cell column circuits ("column circuits") 102 that each include a plurality of memory bit cell circuits 104. Each of the column circuits 102 includes a column read circuit 106 configured to generate a column output signal 108 corresponding to a logic state stored in one of the memory bit cell circuits 104 in a read operation. A first read bit line 110 is coupled to each of a first plurality of memory bit cell circuits 112 of the plurality of memory bit cell circuits 104. A second read bit line 114 is coupled to each of a second plurality of memory bit cell circuits 116 of the plurality of memory bit cell circuits 104. The column read circuit 106 is coupled to both of the first read bit line 110 and the second read bit line 114. A read word line RWL in each row (not shown) of the memory array circuit 100 is coupled to each of the memory bit cell circuits 104 in the corresponding row. The read word line RWL is activated in a selected one of the rows being read in a read operation. In each column circuit 102, the column read circuit 106 is configured to read the logic state of the selected one of the plurality of memory bit cell circuits 104, which may be among the first plurality of memory bit cell circuits 112 and the second plurality of memory bit cell circuits 116, depending on the selected row. Read word lines RWL(0)-RWL(M) are coupled to the first plurality of memory bit cell circuits 112 and read word lines RWL(M+1)-RWL(N) are coupled to the second plurality of memory bit cell circuits 116. Each column circuit 102 may include, for example, sixty-four (64) memory bit cell circuits 104, with each of the first plurality of memory bit cell circuits 112 and the second plurality of memory bit cell circuits 116 including thirty-two (32) of the plurality of memory bit cell circuits 104 (e.g., M=31 and N=63). The plurality of memory bit cells 104 may be divided into the first plurality of memory bit cells 112 and the second plurality of memory bit cells 116 to improve performance of the read operation in the memory array circuit 100. In this regard, the first and second read bit lines 110 and 114 may have lower capacitance than a single read bit line due to having shorter length and a reduced number of loads. In other examples, the memory array circuit 100 may include any number of the column circuits 102. Each of the column circuits 102 may include one or more read bit lines coupled to any number of memory bit cell circuits 104. The memory array circuit 100 in FIG. 1 may be a conventional memory circuit including conventional column circuits as shown in FIG. 2. Alternatively, the memory array circuit 100 in FIG. 1 may be an exemplary memory array circuit including exemplary column circuits, as shown in FIGS. 4A and 4B, and disclosed herein.

FIG. 2 is a schematic diagram illustrating features of a bit cell column circuit ("column circuit") 200 that is employed in a conventional memory array circuit 202 corresponding to the memory array circuit 100 in FIG. 1. The conventional memory array circuit 202, including conventional bit cell column circuits 200, is presented first to provide background for understanding exemplary aspects disclosed herein. The illustrated features of the column circuit 200 are employed for performing read operations of memory bit cell circuits 204 in any row (not shown) of the memory array circuit 202 in the column circuit 200. Before describing a read operation, the illustrated features are first described.

The column circuit 200 includes a column read circuit 206 coupled to a first read bit line 208 and to a second read bit line 210. The first read bit line 208 is further coupled to a first read port circuit 212 in each of a first plurality of memory bit cell circuits 214, as shown in FIG. 1. The second read bit line 210 may be coupled to a second read port circuit 216 of a second plurality of memory bit cell circuits 218 of the column circuit 200.

The column read circuit 206 includes pull-up circuits 224(1) and 224(2) coupled to the first and second read bit lines 208 and 210, respectively. The column circuit 200 also includes a read control circuit 222 coupled to the pull-up circuits 224(1) and 224(2). The read control circuit 222 generates pull-up signals 220(1) and 220(2) that control the pull-up circuits 224(1) and 224(2), respectively, in the column read circuit 206. The pull-up circuits 224(1) and 224(2) are turned on by the pull-up signals 220(1) and 220(2) to electrically couple the first and second read bit lines 208 and 210 to a supply voltage rail 226 (e.g., $V_{DD}$) between read operations, which may be referred to as an idle stage. The pull-up circuits 224(1) and 224(2) are electrically conductive when turned on. With the pull-up circuits 224(1) and 224(2) turned on, the supply voltage rail 226 charges ("pulls-up") the first and second read bit lines 208 and 210 to a voltage $V_{CHG}$ based on a supply voltage $V_{SUP}$ on the supply voltage rail 226. As explained further below, the pull-up circuits 224(1) and 224(2) prepare the column circuit 200 for a read operation and one of the pull-up circuits 224(1) and 224(2) is deactivated during the read operation. That is, since a memory bit cell circuit 204 being read in the read operation may be coupled to only one of the first read bit line 208 and the second read bit line 210, one of the pull-up circuits 224(1) and 224(2) is deactivated while the other one remains active during a read operation. The column read circuit 206 also includes keep-up circuits 228(1) and 228(2) configured to selectively couple the first and second read bit lines 208 and 210, respectively, to the supply voltage rail 226 during a read operation.

Each of the memory bit cell circuits 204 stores the logic state of data (e.g., a "bit" of binary data) as either a high voltage level or a low voltage level on a data node. Each of the memory bit cell circuits 204 also stores, on a complement data node, a logical complement of the logic state on the data node. For example, a binary "0" is a first logic state that may be stored as a low voltage level corresponding to a ground voltage, $V_{SS}$, and a binary "1" is a second logic state that may be stored as a high voltage level corresponding to a supply voltage, $V_{DD}$. A logic state of "1" on a data node in one of the memory bit cell circuits 204 corresponds to a complement logic state of "0" on a complement data node. A logic state of "0" stored on a data node corresponds to a complement logic state of "1" on the complement data node.

The read port circuits 212 and 216 are employed in the memory bit cell circuits 204 to generate the logic state of the stored data on the read bit lines 208 and 210. In on example, the read port circuits 212 and 216 may include transistors 230(1) and 232(1) that are "stacked" or coupled in series between the first read bit line 208 and a ground voltage rail 234 supplying the ground voltage (e.g., $V_{SS}$). The transistors 230(1) and 232(1) may be "turned on" to allow current to flow in response to a voltage on gates 236 and 238, respectively. With both of the transistors 230(1) and 232(1) turned on, a charge on the first read bit line 208 may be discharged to the ground voltage rail 234. The gate 236 of the transistor 230(1) is controlled by a read word line signal RWL. The gate 238 of the transistor 232(1) is coupled to the complement data node (not shown) of the memory bit cell circuit.

The column read circuit 206 includes a column output circuit 240 that performs a logical NOT-AND (NAND) function by which a column output signal 242 is generated in a low voltage state (e.g., corresponding to ground voltage, $V_{SS}$) only if both of the first read bit line 208 and the second read bit line 210 are at a high voltage level (e.g., corresponding to the supply voltage, $V_{DD}$). If either one of the first read bit line 208 and the second read bit line 210 inputs is in the low voltage state, while the other is kept pre-charged (e.g., in a high voltage state) the column output signal 242 is generated in a high voltage state. Thus, the column output signal 242 is based on one of the first read bit line 208 and the second read bit line 210 being pulled-up by the corresponding one of the pull-up circuits 224(1) and 224(2) and on a voltage state of the other one of the first read bit line 208 and the second read bit line 210, which is based on a logic state stored therein.

The column read circuit 206, the read control circuit 222, and the first and second read bit lines 208 and 210 are inactive in an idle stage between read operations. In the idle stage, the read control circuit 222 controls the pull-up circuits 224(1) and 224(2) to keep the first and second read bit lines 208 and 210 charged to a pre-charged state, to keep the column circuit 200 ready for a read operation, as described below. In the idle stage, the keep-up circuits 228(1) and 228(2) are turned off.

A read operation of one of the memory bit cell circuits 204 in the first plurality of memory bit cell circuits 214 in the column circuit 200 is described as an example. A read operation in the memory array circuit 202 reads data stored in the memory bit cell circuits 204 in a selected row (not shown) of the memory array circuit 202. Thus, the read operation reads data stored in one of the memory bit cell circuits 204 in the column circuit 200. As shown in the timing diagram in FIG. 3, below, a read enable signal RDEN received in the read control circuit 222 transitions to an active state to indicate a read operation. While the read enable signal RDEN is in the active state, a system clock signal CLK (see FIG. 3) transitions to a first clock state, triggering the read control circuit 222 to shut off the pull-up circuits 224(1) and 224(2). Shutting off the pull-up circuits 224(1) and 224(2) decouples the first read bit line 208 and the second read bit line 210 from the supply voltage rail 226 while the first read bit line 208 and the second read bit line 210 are in the pre-charged state. The first read bit line 208 and the second read bit line 210 may be discharged by leakage currents in the first and second read port circuits 212 and 216 in the first and second pluralities of memory bit cell circuits 214 and 218. The keep-up circuits 228(1) and 228(2) are turned on during a read operation to selectively prevent the first read bit line 208 and the second read bit line 210 from discharging due to the leakage currents.

Figure 3:
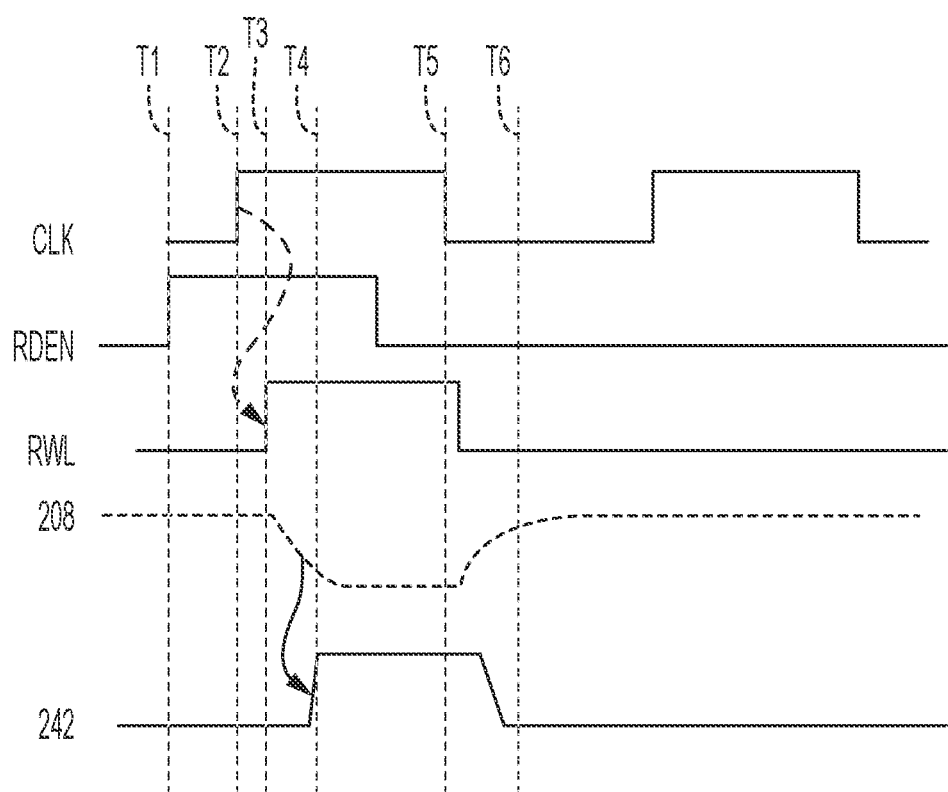
FIG. 3 is a timing diagram illustrating control and data signals internal to the conventional memory array circuit of FIG. 2 in a read operation.

The transition of the system clock signal CLK to the first clock state also activates the read word line signal RWL (e.g., to a high voltage) of the selected row to turn on the transistor 232(1) in the first read port circuit 212 to prepare for generating the logic state of the stored data on the column output signal 242. As an example, if the binary data state stored in the selected one of the first plurality of memory bit cell circuits 214 corresponds to a high voltage (e.g., "1"), the complement data node is at a low voltage. Thus, in this example, the transistor 230(1) coupled to the complement data node, is not turned on and the first read bit line 208 is not discharged from the pre-charged state. Alternatively, if the logic state of the data stored in the selected one of the first plurality of memory bit cell circuits 214 corresponds to the low voltage state (e.g., "0") and the complement data node is at a high voltage, the transistor 230(1) is turned on and the first read bit line 208 discharges to a discharged state based on the ground voltage (e.g., $V_{SS}$) of the ground voltage rail 234, as shown in FIG. 3.

In other words, in the example in which the logic state of the data stored in the selected one of the first plurality of memory bit cell circuits 214 is low ("0"), the first read bit line 208 is in the pre-charged state based on the supply voltage (e.g., $V_{DD}$) of the supply voltage rail 226. Since the second read bit line 210 is pulled up to a high voltage state by the pull-up circuit 224(2), the NAND function of the column output circuit 240 (described above), generates the column output signal 242 in a low voltage state ("0"), which corresponds to the logic state of the data stored in the selected one of the first plurality of memory bit cell circuits 214 in this example.

In the other example, in which the logic state of the data stored in the selected one of the first plurality of memory bit cell circuits 214 is high ("1"), the first read bit line 208 is discharged to a low voltage ("0") state and the NAND function of the column output circuit 240 (described above) causes the column output signal 242 to transition to the high state ("1"). In this manner, the logic state of the column output signal 242 corresponds to the logic state of the data stored in the selected one of the first plurality of memory bit cell circuits 214.

The keep-up circuits 228(1) and 228(2) are turned on during a read operation, to keep the first and second read bit lines 208 and 210 from discharging slowly due to leakage currents in the first and second read port circuits 212 and 216, respectively. Allowing the first and second read bit lines 208 and 210 to discharge would change the column output signal 242. The keep-up circuit 228(1) includes transistors 244(1) and 246(1) and the keep-up circuit 228(2) includes the transistors 244(2) and 246(2). The transistors 244(1), 244(2), 246(1), and 246(2) in this example are turned on, to become electrically conductive, by signals in a low voltage state. The read control circuit 222 turning on the keep-up circuits 228(1) and 228(2) includes providing a control signal 248 to the transistors 246(1) and 246(2) at a low voltage. The column output signal 242 is coupled to the transistors 244(1) and 244(2) and are, therefore, controlled by a voltage state of the column output signal 242. At the beginning of the read operation, with the pull-up circuits 224(1) and 224(2) being shut off and before the read word line signal RWL is activated, the first and second read bit lines 208 and 210 are fully charged. Providing high voltages to the column output circuit 240 generates a low voltage on the column output signal 242 based on the NAND function of the column output circuit 240. The low voltage state on the column output signal 242 turns on the transistors 244(1) and 244(2) in the keep-up circuits 228(1) and 228(2), which keeps the first and second read bit lines 208 and 210 coupled to the supply voltage rail 226. With the transistors 244(1) and 244(2) turned on, the first read bit line 208 remains charged in the pre-charged (high voltage) state. The second read bit line 210 similarly remains charged.

As discussed above, the logic state of the data stored in the plurality of memory bit cell circuits 204 is generated on the column output signal 242 in response to the read word line signal RWL in a read operation. If the logic state of the stored data corresponds to the low voltage state, the column output signal 242 remains at a low voltage in response to the read word line signal RWL, which keeps the transistors 244(1) and 244(2) in the keep-up circuits 228(1) and 228(2) turned on and continuing to charge the first and second read bit lines 208 and 210. On the other hand, if the logic state of the data stored in the selected one of the first plurality of memory bit cell circuits 214 is high, the first read bit line 208 will be discharged and the state of the column output signal 242 will become high, which will turn off the transistors 244(1) and 244(2). Thus, the keep-up circuits 228(1) and 228(2) will not continue to provide a charge to the first and second read bit lines 208 and 210 and they are discharged by the first and second read port circuits 212 and 216. The column output signal 242 remains in a low voltage state until the read operation is complete. The system clock signal CLK transitions back to a second clock state, indicating the end of the read operation and the indicating the idle stage. Regardless of the logic state of the data stored in the selected one of the first plurality of memory bit cell circuits 214, when the read operation is complete, the keep-up circuits 228(1) and 228(2) are turned off (i.e., the transistors 246(1) and 246(2) are turned off) and the pull-up circuits 224(1) and 224(2) are turned on to prepare the column circuit 200 for another read operation. In response to the indication of the idle stage, the pull-up circuits 224(1) and 224(2) are again turned on to pre-charge the first and second read bit lines 208 and 210 to prepare for the next read operation.

FIG. 3 is a timing diagram illustrating signals of the conventional memory array circuit 202 of FIG. 2 during the read operation, as discussed above. The beginning of the read operation is indicated by a transition of the read enable signal RDEN to an active state at time T1. The read enable signal RDEN may be provided to the column circuit 200 by a memory controller or a processor, for example. If the read enable signal RDEN is in the activate state, the pull-up circuits 224(1) and 224(2) are turned off in response to a transition of the system clock signal CLK to a first clock state as shown at time T2. In FIG. 3, the first clock state corresponds to a high voltage state but could, instead, by a low voltage state. At time T3, in response to the transition of the system clock signal CLK to the first clock state at time T2, the read word line signal RWL is activated to turn on the transistor 232(1) in the first read port circuit 212 in a selected row in the first plurality of the memory bit cell circuits 214. The pull-up circuits 224(1) and 224(2) are turned off at time T3 in FIG. 3 and the keep-up circuits 228(1) and 228(2) are turned on. Signals of the keep-up circuits 228(1) and 228(2) are not illustrated in FIG. 3.

FIG. 3 illustrates an example of the read operation in which the logic state of the complement data stored in the memory bit cell circuit corresponds to a high voltage state. With the complement data node coupled to the gate 236, the high voltage state stored on the complement data node turns on the transistor 230(1) and the first read bit line 208 discharges to the discharged state (low voltage state). As the memory bit cell circuit being read is not coupled to the second read bit line 210, the second read bit line 210 remains pulled-up to a high voltage state. A low voltage state on first read bit line 208 coupled to the column output circuit 240 causes the column output signal 242 to transition to the high voltage state at time T4. In response to a transition of the system clock signal CLK back to the second clock state at time T5, the read word line signal RWL is deactivated and the pull-up circuits 224(1) and 224(2) are turned on again to begin to provide a charge to the first and second read bit lines 208 and 210 at time T6, to prepare for another read operation.

FIG. 4A is a schematic diagram illustrating features of a memory system 400 including one or more bit cell column circuits 402 ("column circuits 402") each including a plurality of memory bit cell circuits 404 ("memory bit cells 404") (e.g., SRAM bit cells) that each store a logic state of data. The logic state stored in a selected one of the memory bit cells 404 can control a read port circuit 408 in the memory bit cell 404 to determine a logic state generated onto the read bit line 406. The read port circuit 408 includes a read port output 410 and the read port outputs 410 of multiple memory bit cells 404 in a same column 412 are coupled to the read bit line 406. The memory system 400 includes a column read circuit 414 to evaluate the logic state on the read port output 410 of the selected memory bit cell 404. The column read circuit 414 includes an evaluation output line 416 coupled to the read port circuits 408 by the read bit line 406 in a dynamic read circuit structure. The column read circuit 414 also includes a pre-charge circuit 418 that is activated to pre-charge the evaluation output line 416 in an idle stage between read operations and in a pre-charge stage of a read operation. The column read circuit 414 includes a float control circuit 420 coupled inline between the evaluation output line 416 and the read bit line 406. The memory system 400 includes a read control circuit 422 to control activation and deactivation of the float control circuit 420. While the evaluation output line 416 is pre-charged by the pre-charge circuit 418 in the idle stage between read operations, the float control circuit 420 is deactivated to isolate the evaluation output line 416 from the read bit line 406 and the read port circuits 408.

In other words, the read bit line 406 and the read port outputs 410 of the read port circuits 408 are kept in a floating state in the idle stage so the pre-charge circuit 418 only pre-charges the evaluation output line 416, which reduces power consumption that may be caused by leakage current through the read port circuits 408. Herein, the term "floating" or being in a "floating state" indicates that the read bit line 406 and the read port outputs 410 are not electrically coupled (e.g., by a low resistance or highly conductive path) to a supply voltage rail, so as to not receive a supply voltage (e.g., $V_{DD}$), a ground voltage (e.g., $V_{SS}$), or any intermediate voltage between the supply voltage and the ground voltage. Thus, a node that is floating is not charged or quickly discharged, although a leakage current can slowly discharge a node that is charged when put in a floating state. Because there are a plurality of memory bit cells 404 in a column 412 and each memory bit cell 404 includes a read port circuit 408, power loss due to leakage would be much higher if the evaluation output line 416 is coupled to the read bit line 406 in the idle stage. In the pre-charge stage of the read operation, prior to an evaluation stage of the read operation, the float control circuit 420 is activated to couple the evaluation output line 416 to the read bit line 406 and the read port circuits 408 to briefly pre-charge the dynamic read circuit for evaluation. Due to a voltage drop across the float control circuit 420, the read bit line 406 and the read port outputs 410 are pulled up ("charged") to a voltage $V_{CHG}$ lower than the power supply voltage (e.g., $V_{DD}$), which saves power and reduces the time required to charge the read bit line 406. The pre-charge circuit 418 is deactivated in the evaluation stage of the read operation and the read port circuit 408 of the selected memory bit cell 404 is activated to provide an evaluation of the stored logic state to the evaluation output line 416. A read word line 424 coupled to the selected memory bit cell 404 provides a read word line signal RWL that activates the read port circuit 408 in the evaluation stage. The stored logic state in the selected memory bit cell 404 controls the read port circuit 408 to indicate the stored logic state on the evaluation output line 416. The read port circuit can be two stacked transistors 426 and 428 controlled by the read word line signal RWL and the stored logic state, respectively, to pre-charge or discharge the read bit line 406 based on the logic state stored in the memory bit cell 404. After the read operation, the float control circuit 420 is deactivated in the idle stage.

The column read circuit 414 includes a column output circuit 430 that is configured to generate a column output signal 432 based on the logic state (i.e., voltage level) of the evaluation output line 416. The column output circuit 430 generates the column output signal 432 based on whether the evaluation output line 416 is in a first pre-charged state or a discharged state. The column output circuit 430 may be an inverter circuit that generates the column output signal 432 having a logic state that is complementary to the logic state of the evaluation output line 416. In another example, the column output circuit 430 may be a buffer circuit that passes the same logic state from the evaluation output line 416 to the column output signal 432. The column output circuit 430 may be determined based on a desired polarity of the logic state on the column output signal 432 compared to the logic state of the data stored in the selected one of the memory bit cell circuits 404.

The memory system 400 includes at least one of the column circuits 402, each column 412 including a plurality of the memory bit cell circuits 404. The memory system 400 may be a memory array circuit or a register file circuit, for example. The read bit line 406 is coupled to a first plurality 434 of the memory bit cell circuits 404 of the plurality of memory bit cell circuits 404. The column read circuit 414 and the read control circuit 422 are included in each of the at least one column circuits 402 and employed in read operations to read the logic state of data stored in a selected row (not shown) of the first plurality 434 of memory bit cell circuits 404 in the memory system 400.

The column read circuit 414 includes a pre-charge circuit 418 that is configured to pre-charge the evaluation output line 416 at the beginning of a read operation. Pre-charging the evaluation output line 416 may include coupling the evaluation output line 416 to a supply voltage rail 436 that provides a supply voltage $V_{DD}$, for example, in response to receiving a pre-charge signal 438. The evaluation output line 416 may be charged by the pre-charge circuit 418 to a first pre-charged state at a voltage $V_{PRE}$ that is based on the supply voltage $V_{DD}$. Due to a voltage drop across the pre-charge circuit 418, the voltage $V_{PRE}$ may be lower than the supply voltage $V_{DD}$. The pre-charge circuit 418 may be a transistor, such as a P-type field effect transistor (FET) (PFET). In this regard, the pre-charge circuit 418 may be "turned on" to be electrically conductive in response to receiving the pre-charge signal 438 in an active state, which would be a low-voltage state (e.g., 0 volts) to turn on a PFET. If the pre-charge circuit 418 comprises an N-type FET (NFET), the active state of the pre-charge signal 438 would be a high-voltage state (e.g., $V_{DD}$). A PFET is transistor in which a semiconductor (e.g., silicon) is doped with a trivalent impurity and an NFET includes a semiconductor doped with a pentavalent impurity.

The read control circuit 422 is configured to generate the pre-charge signal 438 in the active state in response to receiving an indication of an idle stage in the memory system 400. The read control circuit 422 is also configured to generate the pre-charge signal 438 in the active state in response to receiving an indication of a pre-charge stage of a read operation in the memory system 400. The read control circuit 422 is configured to generate the pre-charge signal 438 in an inactive state (e.g., high voltage signal for the pre-charge circuit 418 comprising a PFET) in response to receiving an indication of an evaluation stage of a read operation in the memory system 400. The pre-charge stage, the evaluation stage, and the idle stage are described below.

An indication of the idle stage is received in the read control circuit 422 at the end of a read operation, and the memory system 400 remains in an idle stage until the read control circuit 422 receives an indication of a pre-charge stage of another read operation. The indications of the pre-charge stage, the evaluation stage, and the idle stage are based on receiving a read enable signal RDEN and a system clock signal CLK. The indication of a pre-charge stage may include receiving a transition of the read enable signal RDEN from an inactive state to an active state, indicating the memory system 400 is enabled for a read operation.

In response to receiving the indication of the pre-charge stage, the read control circuit generates a float control signal 440 in an active state to turn on the float control circuit 420. The float control circuit 420 is coupled between the read bit line 406 and the evaluation output line 416. The float control circuit 420 is configured to couple the read bit line 406 to the evaluation output line 416 in the pre-charge stage. With the evaluation output line 416 coupled to the read bit line 406 through the float control circuit 420 in the pre-charge stage, the pre-charge circuit 418 charges the read bit line 406 during the pre-charge stage, prior to the evaluation stage. The read bit line 406 is charged during the pre-charge stage to a second pre-charged state at a voltage $V_{CHG}$ based on the voltage $V_{PRE}$ of the evaluation output line 416. The voltage $V_{CHG}$ of the read bit line 406 in the second pre-charged state may be lower than a voltage $V_{PRE}$ of the evaluation output line 416 in the first pre-charged state, due to a voltage drop across the float control circuit 420. Since the read bit line 406 is charged to the lower voltage $V_{CHG}$, the read bit line 406 may charge more quickly than if connected directly to the evaluation output line 416 without the float control circuit 420. In addition, charging the read bit line 406 only to the lower voltage $V_{CHG}$ for a read operation rather than to the voltage $V_{PRE}$ of the evaluation output line 416 in the first pre-charged state, reduces power consumption of each read operation. The read bit line 406 is coupled to the read port outputs 410 of all of the first plurality 434 of memory bit cell circuits 404. Thus, the read port outputs 410 are also charged in the pre-charge stage based on the lower voltage $V_{CHG}$. The read port circuits 408 include the transistors 426 and 428. The read port circuit 408 in a selected one of the first plurality 434 of memory bit cell circuits 404 may be activated by a corresponding read word line signal RWL. The read word line signals RWL remain inactive during the pre-charge stage, to prevent the read port circuit 408 from turning on. Despite some leakage current that may flow through the read port circuits 408, the read bit line 406 is charged during the pre-charge stage.

The pre-charge stage ends when the read control circuit 422 receives the indication of the evaluation stage. Receiving the indication of the evaluation stage of a read operation in the read control circuit 422 includes receiving the read enable signal RDEN in the active state and receiving a transition of the system clock signal CLK to a first clock state from a second clock state. The read control circuit 422 causes the float control circuit 420 to couple the evaluation output line 416 to the read bit line 406 in the pre-charge stage and in the evaluation stage of the read operation. The column read circuit 414 is configured to evaluate a stored logic state of a selected one of the first plurality 434 of memory bit cell circuits 404 on the evaluation output line 416 in the evaluation stage. The evaluation stage of a read operation begins after the pre-charge stage, during which the read bit line 406 is pre-charged to the second pre-charged state at a voltage $V_{CHG}$. The read control circuit 422 is further configured to, in response to receiving the indication of the evaluation stage, generate the pre-charge signal 438 in the inactive state to turn off the pre-charge circuit 418, to decouple the evaluation output line 416 from the supply voltage rail 436. In addition, in response to receiving the indication of the evaluation stage, the read control circuit 422 continues to generate the float control signal 440 in an active state to keep the float control circuit 420 turned on, to continue to couple the evaluation output line 416 to the read bit line 406. Therefore, in the evaluation stage, the pre-charge circuit 418 is no longer charging the evaluation output line 416 and the read bit line 406. To prevent the evaluation output line 416 and the read bit line 406 from discharging slowly due to leakage currents through the read port circuits 408 in the first plurality 434 of memory bit cell circuits 404, the column read circuit also includes a keep-up circuit 442. The keep-up circuit 442 continues to charge the evaluation output line 416 as long as the column output signal 432 remains in a low voltage state. That is, the evaluation output line 416 is charged to the first pre-charged state in the pre-charge stage, causing the column output circuit 430 to generate the column output signal 432 in the low voltage state. The keep-up circuit 442 continues to charge the evaluation output line 416 faster than the evaluation output line 416 is discharged by the read port circuits 408 in the first plurality 434 of memory bit cell circuits 404. In the evaluation stage, the read bit line 406 may remain charged or may be discharged by the read port circuit 408, depending on the logic state of data stored in the selected one of the first plurality 434 of the memory bit cell circuits 404.

The read port circuits 408 include transistors 426 and 428, which are coupled in series ("stacked") between the read bit line 406 and a ground voltage rail 444 at a low voltage or ground voltage $V_{SS}$ (e.g., 0 volts), for example. With both of the transistors 426 and 428 turned on, the read bit line 406 may be coupled to the ground voltage rail 444. In the evaluation stage, coupling the read bit line 406 to the ground voltage rail 444 discharges the read bit line 406 to a discharged state based on the ground voltage, as follows.

The transistor 426 is coupled between the read port output 410, which is coupled to the read bit line 406, and the transistor 428. The transistor 426 is also coupled to the read word line 424 and controlled by the read word line signal RWL. The read word line signal RWL is received by the read port circuit 408 in an active state in a selected one of the first plurality 434 of the memory bit cell circuits 404. The selected one of the memory bit cell circuits 404 is in a row of the memory system 400 that is the target of a read address to be read in the read operation. The transistor 428 is coupled between the transistor 426 and the ground voltage rail 444. The transistor 428 is coupled to a data node (not shown) of the memory bit cell circuit 404. The transistor is controlled by a logic state of stored data, which is indicated by a voltage level on the data node. The data node coupled to the transistor 428 may be a data node that stores the "true" logic state or a complement data node that stores a "complement" logic state. In some examples, the transistor 428 may be an NFET that is activated by a first logic state corresponding to a high voltage level. Thus, with the read word line signal RWL received in the active state and a high voltage state stored on the data node coupled to the transistor 428, the read port circuit 408 is turned on, becoming electrically conductive, to allow the read bit line 406 to discharge to the ground voltage rail 444. Corresponding to the high voltage in response to receiving the read word line signal RWL in the active state, the read port circuit 408 is activated. In other words, in response to receiving the read word line signal RWL in an active state and the logic state of the data stored on the data node comprising a first logic state (e.g., corresponding to a high voltage on the data node), the read port circuit 408 couples the read bit line 406 to the ground voltage rail 444 to discharge the evaluation output line 416 to a discharged state. Alternatively, in response to the read word line signal RWL in the active state and the logic state of the data stored on the data node comprising a second logic state (e.g., corresponding to a low voltage stored on the data node), the read port circuit 408 decouples the read bit line 406 from the ground voltage rail 444 to keep the evaluation output line 416 in the first pre-charged state. In this situation, with the read port circuit 408 discharging the read bit line 406 and the evaluation output line 416, the evaluation output line 416 is discharged faster than it is charged by the keep-up circuit 442. Consequently, the column output signal 432 transitions to a high voltage state based on the evaluation output line 416 being in the discharged state and the keep-up circuit 442 is turned off to decouple the evaluation output line 416 from the supply voltage rail. In another example, the transistor 428 may be implemented by a PFET responsive to a logic state that corresponds to a low voltage level. In this example, the voltage levels corresponding to the first and second logic states would be reversed.

The logic state stored in the selected one of the memory bit cell circuits 404 is generated as the column output signal 432 in the read operation. The read operation ends when the read control circuit 422 receives an indication of the idle stage. The read control circuit 422 causes the float control circuit 420 to decouple the evaluation output line 416 from the read bit line 406 in the idle stage. Receiving the indication of the idle stage includes the read control circuit 422 receiving the read enable signal RDEN in an inactive state and also receiving a transition of the system clock signal CLK back to the second clock state. The first clock state and the second clock state of the system clock signal CLK may correspond to a high voltage state and a low voltage state, respectively, or may correspond to a low voltage state and a high voltage state, respectively, for example.

In response to receiving the indication of the idle stage, the read control circuit 422 generates the float control signal 440 in the inactive state, which causes the float control circuit 420 to turn off and decouple the evaluation output line 416 from the read bit line 406 in the idle stage. In addition, the read control circuit 422 generates the pre-charge signal 438 in response to receiving the indication of the idle stage to pre-charge the evaluation output line 416 to the first pre-charged state, to be ready for the next read operation.

FIG. 4B is a schematic diagram illustrating the exemplary memory system 400 in FIG. 4A including the bit cell column circuit 402 including the column read circuit 414 coupled to the first read bit line 406 shown in FIG. 4A and also coupled to a second read bit line 446. The first read bit line 406 is coupled to the first plurality 434 of memory bit cell circuits 404. The second read bit line 446 is coupled to a second plurality 448 of the plurality of memory bit cell circuits 404 in the memory system 400.

Performance of the memory system 400 in a memory read operation may be improved by reducing a number of the memory bit cells 404 to which the read bit line 406 is coupled in a column circuit 402. Both a length of the read bit line 406 and the number of capacitive loads (e.g., read port outputs 410) may be reduced compared to having all memory bit cell circuits 404 in a column 412 coupled to the first read bit line 406. For this reason, the memory bit cell circuits 404 in each column 412 may be divided among a plurality of (e.g., two or more) read bit lines, such as the first read bit line 406 and the second read bit line 446. The first read bit line 406 is coupled to the evaluation output line 416 through the float control circuit 420 and the second read bit line 446 is coupled to the evaluation output line 416 through a second float control circuit 450. Since only one of the memory bit cell circuits 404 in a column 412 may be read in a read operation, only one of the float control circuits 420 and 450 is activated at a time, while the other float control circuit(s) remain deactivated to reduce power loss.

The memory system 400 may comprise a memory array circuit including a first bank and a second bank (not shown). In some examples, the memory system 400 may include a plurality of the column circuits 402 that each include sixty-four (64) memory bit cell circuits 404 (0:63), the first plurality 434 of the memory bit cell circuits 404 may comprise memory bit cell circuits (0:31) in the column circuit 402 and the second plurality 448 of the memory bit cell circuits 404 may comprise memory bit cell circuits (32:63), for example. The column circuit 402 may comprise any number of memory bit cell circuits 404 and the first plurality 434 of memory bit cell circuits 404 may include a different number of memory bit cell circuits 404 than the second plurality 448 of memory bit cell circuits 404. The memory bit cell circuits 404 may be SRAM bit cell circuits, such as six transistor (6T), eight transistor (8T), and/or ten transistor (10T) SRAM bit cell circuits, for example, but the exemplary column circuit 402 may be employed in memory array circuits 402 including any type(s) of memory bit cell circuit that stores the logic state of a "bit" of binary data corresponding to either a high voltage state or a low voltage state. For example, a binary "0" may be stored on a data node configured to store a data as a low voltage state corresponding to a ground voltage, $V_{SS}$, and a binary "1" may be stored as a high voltage state corresponding to a supply voltage, $V_{DD}$. In some examples, a binary "0" is represented by a high voltage and a binary "1" is represented by a low voltage. A stored data having a logic state of "1" on a data node corresponds to a complement logic state of "0" on a complement data node, and a stored logic state of "0" on the data node corresponds to a complement logic state of "1" on the complement data node.

In some examples, the first plurality 434 of the memory bit cell circuits 404 may be in a first bank (not shown) of the memory system 400 and the second plurality 448 of the memory bit cell circuits 404 may be in a second bank (not shown) of the memory system 400. Alternatively, the first and second pluralities 434, 448 of the memory bit cell circuits 404 may both be in the same column 412 in a first bank of a memory system and at least one additional read bit line (not shown) may be coupled to the evaluation output line 416 and to a third plurality of the memory bit cell circuits 404 of the memory system 400 in a second bank. The read control circuit 422 in FIG. 4B is configured to control the column read circuit 414 to selectively couple one of the first read bit line 406 and the second read bit line 446 to the evaluation output line 416 in a read operation based on indication of a read address. The read control circuit 422 may be configured to control any number of float control circuits each corresponding to a read bit line coupled to a plurality of memory bit cell circuits 404 in a column 412. The read control circuit 422 causes the first read bit line 406 to be coupled to the evaluation output line 416 if the row selected for the read operation based on the read address includes one of the first plurality 434 of memory bit cell circuits 404. The read control circuit 422 is configured to cause the second read bit line 446 to couple to the evaluation output line 416 if the row selected for the read operation based on the read address includes one of the second plurality 448 of memory bit cell circuits 404. While one of the first read bit line 406 and the second read bit line 446 is coupled to the evaluation output line 416, the other one(s) of the first read bit line 406 and the second read bit line 446 (and others, if any) remains electrically decoupled from the evaluation output line 416. Thus, the evaluation output line 416 is charged or discharged based on only one of the first read bit line 406 and the second read bit line 446 and the column output circuit 430 is electrically coupled to only one of the first read bit line 406 or the second read bit line 446 at a time.

The second read bit line 446 coupled to the second plurality 448 of the memory bit cells 404 in the memory system 400 performs a read operation in a manner corresponding to the description above of a read operation of one of the first plurality 434 of the memory bit cell circuits 404 on the first read bit line 406. Any additional read bit lines coupled to memory bit cell circuits 404 in a column 412 would also be controlled by the read control circuit 422 in a read operation as discussed above with regard to the first read bit line 406.

Referring again to FIG. 4B, the memory system 400 includes the first read bit line 406 coupled to the float control circuit 420. The memory system 400 includes the second read bit line 446 coupled to the second plurality 448 of the memory bit cell circuits 404 in the bit cell column circuit 402. The column read circuit 414 further includes the second float control circuit 450 coupled between the evaluation output line 416 and the second read bit line 446. The read control circuit 422 is configured to, in response to an indication that a read operation is directed to one of the first plurality 434 of memory bit cells 404, cause the column read circuit 414 to couple the first read bit line 406 to the evaluation output line 416 in the pre-charge stage and also couple the first read bit line 406 to the evaluation output line 416 in the evaluation stage of the read operation. The read control circuit 422 is also configured to, in response to an indication that a read operation is directed to one of the second plurality 448 of memory bit cells 404, cause the column read circuit to couple the second read bit line 446 to the evaluation output line 416 in the pre-charge stage and also couple the second read bit line 446 to the evaluation output line 416 in the evaluation stage of the read operation. In response to the float control circuit 420 coupling the first read bit line 406 to the evaluation output line 416, the column output signal 432 is based on the first read bit line 406 comprising one of the discharged state and the second pre-charged state. In response to the float control circuit 420 coupling the second read bit line 446 to the evaluation output line 416, the column output signal 432 is based on the second read bit line 446 comprising one of the discharged state and the second pre-charged state.

The read control circuit 422 is also configured to decouple the first read bit line 406 and the second read bit line 446 (and other read bit lines, if any) from the evaluation output line 416 in the idle stage (i.e., between read operations). The read control circuit 422 controls the pre-charge circuit 418 to charge the evaluation output line 416 again in the idle stage to be ready for another read operation.

Figure 5A:
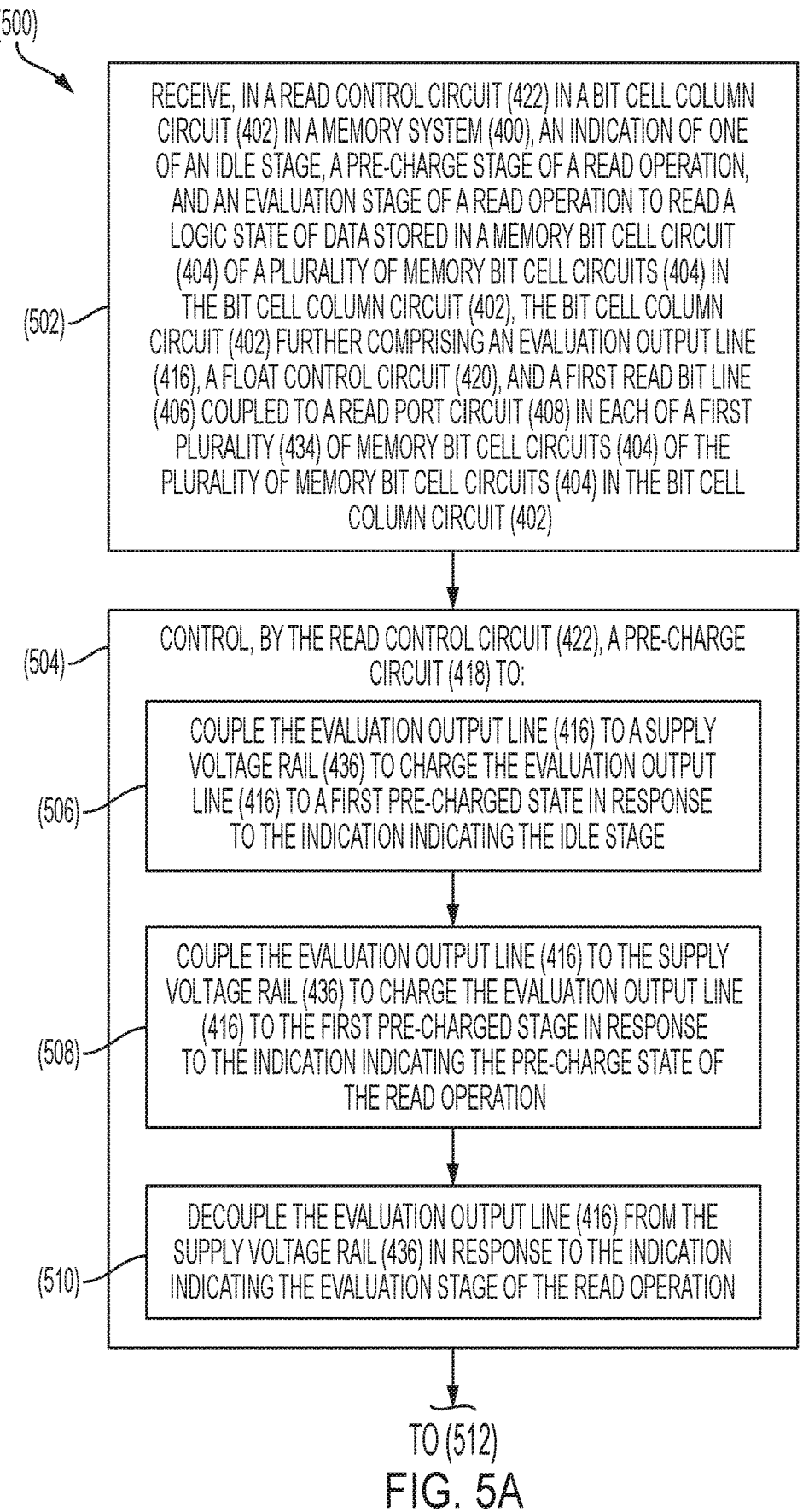
FIGS. 5A-5C are a flowchart illustrating a method of a read operation in the exemplary memory array circuit in FIG. 4A.
Figure 5B:
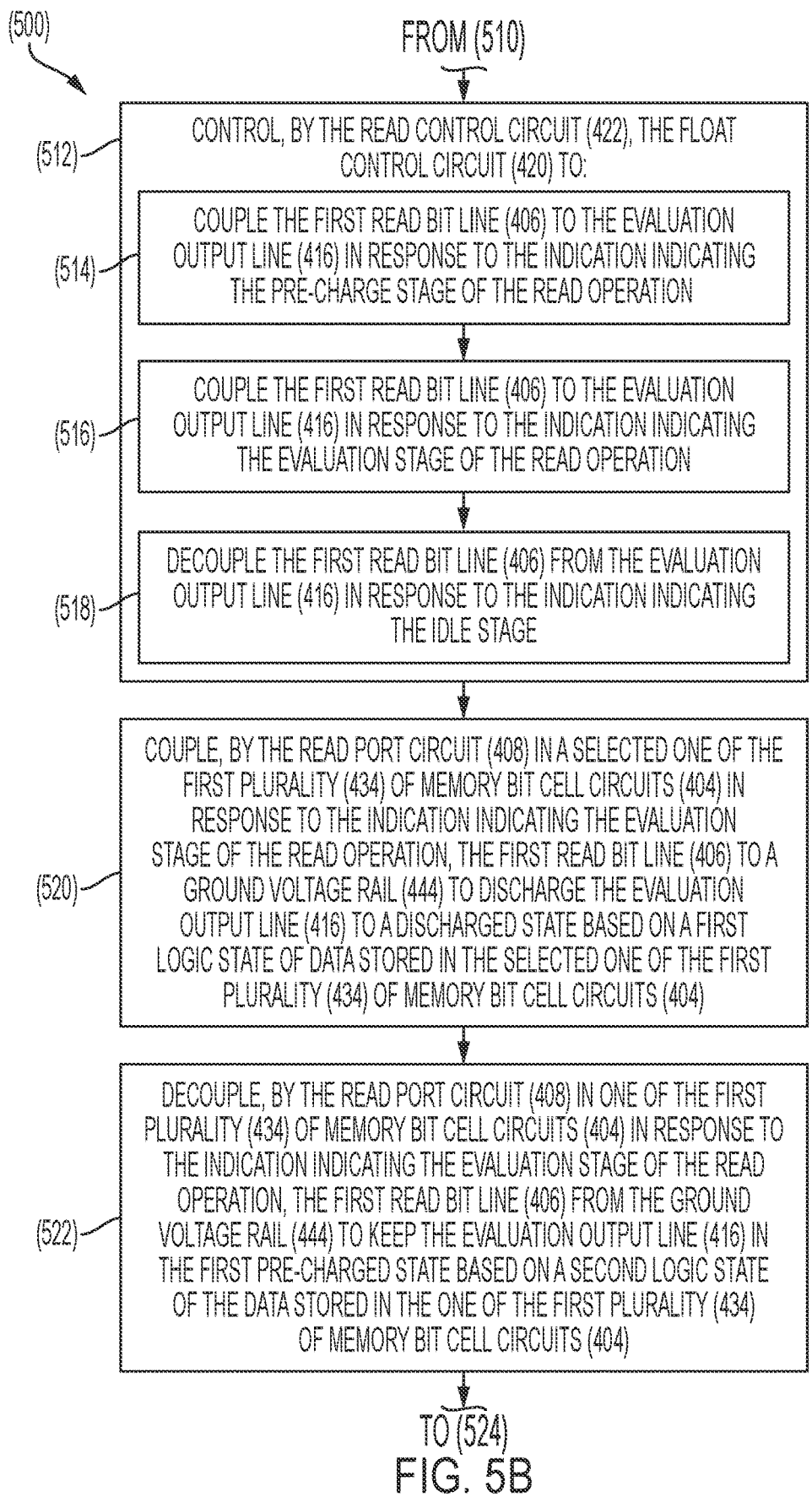
Figure 5C:
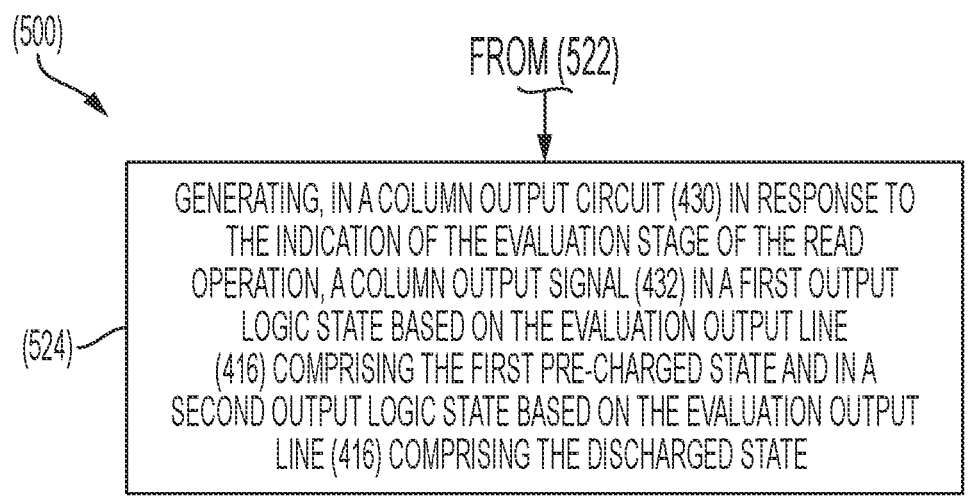

FIGS. 5A-5C are a flowchart illustrating a method 500 of a read operation in the exemplary memory system of FIG. 4A. The method 500 includes receiving, in a read control circuit 422 in a bit cell column circuit 402 in a memory system 400, an indication of one of an idle stage, a pre-charge stage of a read operation, and an evaluation stage of a read operation to read a logic state of data stored in a memory bit cell circuit 404 of a plurality of memory bit cell circuits 404 in the bit cell column circuit 402, the bit cell column circuit 402 further comprising an evaluation output line 416, a float control circuit 420, and a first read bit line 406 coupled to a read port circuit 408 in each of a first plurality 434 of memory bit cell circuits 404 of the plurality of memory bit cell circuits 404 in the bit cell column circuit 402 (block 502). The method includes controlling, by the read control circuit 422, a pre-charge circuit 418 to (block 504) couple the evaluation output line 416 to a supply voltage rail 436 to charge the evaluation output line 416 to a first pre-charged state in response to the indication indicating the idle stage (block 506), couple the evaluation output line 416 to the supply voltage rail 436 to charge the evaluation output line 416 to the first pre-charged state in response to the indication indicating the pre-charge stage of the read operation (block 508), and decouple the evaluation output line 416 from the supply voltage rail 436 in response to the indication indicating the evaluation stage of the read operation (block 510). The method includes controlling, by the read control circuit 422, the float control circuit 420 to (block 512) couple the first read bit line 406 to the evaluation output line 416 in response to the indication indicating the pre-charge stage of the read operation (block 514), couple the first read bit line 406 to the evaluation output line 416 in response to the indication indicating the evaluation stage of the read operation (block 516), and decouple the first read bit line 406 from the evaluation output line 416 in response to the indication indicating the idle stage (block 518). The method includes coupling, by the read port circuit 408 in a selected one of the first plurality 434 of memory bit cell circuits 404 in response to the indication indicating the evaluation stage of the read operation, the first read bit line 406 to a ground voltage rail 444 to discharge the evaluation output line 416 to a discharged state based on a first logic state of data stored in the selected one of the first plurality 434 of memory bit cell circuits 404 (block 520). The method includes decoupling, by the read port circuit 408 in one of the first plurality 434 of memory bit cell circuits 404 in response to the indication indicating the evaluation stage of the read operation, the first read bit line 406 from the ground voltage rail 444 to keep the evaluation output line 416 in the first pre-charged state based on a second logic state of the data stored in the one of the first plurality 434 of memory bit cell circuits 404 (block 522). The method includes generating, in a column output circuit 430 in response to the indication of the evaluation stage of the read operation, a column output signal 432 in a first output logic state based on the evaluation output line 416 comprising the first pre-charged state and in a second output logic state based on the evaluation output line 416 comprising the discharged state (block 524).

FIG. 6 is a timing diagram illustrating control and data signals internal to the exemplary memory system 400 of FIGS. 4A and 4B in a read operation. Prior to a read operation, the evaluation output line 416 is pulled-up to a first pre-charged state. The first read bit line 406 is in a floating state and may be in a discharged state due to leak current. A read operation is initiated at time T1 in response to a read enable signal RDEN and an indication of a read address ADDR. In response to the indication of a read address ADDR and the read enable signal RDEN, the first read bit line 406 is coupled to the evaluation output line 416 and begins charging to a pre-charged state. The second read bit line 446 continues to remain in a floating state. At a time T2, a system clock signal CLK transitions (e.g., rises), which triggers the read control circuit 422, at time T3, to turn off the pre-charge circuit 418 to stop charging the evaluation output line 416, and activate the read word line signal RWL, which turns on the transistor 426 on the read port circuit 408. In the read operation in FIG. 6, the first read bit line 406 is discharged because a stored data in the memory bit cell circuit 404 is in a high state, causing the evaluation output line 416 to transition to the low state. In response to the evaluation output line 416 transitioning to the low state, the column output signal 432 transitions to a high state at time T4. At time T5 the system clock signal CLK transitions again (e.g., falling edge), causing the read control circuit 422 to start charging the evaluation output line 416, and turn off the read word line signal RWL. At time T6 the indication of the read address ADDR may change, causing the first read bit line 406 to decouple from the evaluation output line 416, leaving the first read bit line 406 in a floating state.

FIG. 7 is a block diagram of an exemplary processor-based system 700 that includes a processor 702 (e.g., a microprocessor) that includes an instruction processing circuit 704. The processor-based system 700 may be a circuit or circuits included in an electronic board card, such as a printed circuit board (PCB), a server, a personal computer, a desktop computer, a laptop computer, a personal digital assistant (PDA), a computing pad, a mobile device, or any other device, and may represent, for example, a server, or a user's computer. In this example, the processor-based system 700 includes the processor 702. The processor 702 represents one or more general-purpose processing circuits, such as a microprocessor, central processing unit, or the like. More particularly, the processor 702 may be an EDGE instruction set microprocessor, or other processor implementing an instruction set that supports explicit consumer naming for communicating produced values resulting from execution of producer instructions. The processor 702 is configured to execute processing logic in instructions for performing the operations and steps discussed herein. In this example, the processor 702 includes an instruction cache 706 for temporary, fast access memory storage of instructions accessible by the instruction processing circuit 704. Fetched or prefetched instructions from a memory, such as from a main memory 708 over a system bus 710, are stored in the instruction cache 706. Data may be stored in a cache memory 712 coupled to the system bus 710 for low-latency access by the processor 702. The instruction processing circuit 704 is configured to process instructions fetched into the instruction cache 706 and process the instructions for execution.

The processor 702 and the main memory 708 are coupled to the system bus 710 and can intercouple peripheral devices included in the processor-based system 700. As is well known, the processor 702 communicates with these other devices by exchanging address, control, and data information over the system bus 710. For example, the processor 702 can communicate bus transaction requests to a memory controller 714 in the main memory 708 as an example of a slave device. Although not illustrated in FIG. 7, multiple system buses 710 could be provided, wherein each system bus constitutes a different fabric. In this example, the memory controller 714 is configured to provide memory access requests to a memory array 716 in the main memory 708. The memory array 716 is comprised of an array of storage bit cells for storing data. The main memory 708 may be a read-only memory (ROM), flash memory, dynamic random-access memory (DRAM), such as synchronous DRAM (SDRAM), etc., and a static memory (e.g., flash memory, SRAM, etc.), as non-limiting examples.

Other devices can be connected to the system bus 710. As illustrated in FIG. 7, these devices can include the main memory 708, one or more input device(s) 718, one or more output device(s) 720, a modem 722, and one or more display controllers 724, as examples. The input device(s) 718 can include any type of input device, including but not limited to input keys, switches, voice processors, etc. The output device(s) 720 can include any type of output device, including but not limited to audio, video, other visual indicators, etc. The modem 722 can be any device configured to allow exchange of data to and from a network 726. The network 726 can be any type of network, including but not limited to a wired or wireless network, a private or public network, a local area network (LAN), a wireless local area network (WLAN), a wide area network (WAN), a BLUETOOTH™ network, and the Internet. The modem 722 can be configured to support any type of communications protocol desired. The processor 702 may also be configured to access the display controller(s) 724 over the system bus 710 to control information sent to one or more displays 728. The display(s) 728 can include any type of display, including but not limited to a cathode ray tube (CRT), a liquid crystal display (LCD), a plasma display, etc.

The processor-based system 700 in FIG. 7 may include a set of instructions 730 to be executed by the processor 702 for any application desired according to the instructions. The instructions 730 may be stored in the main memory 708, processor 702, and/or instruction cache 706 as examples of a non-transitory computer-readable medium 732. The instructions 730 may also reside, completely or at least partially, within the main memory 708 and/or within the processor 702 during their execution. The instructions 730 may further be transmitted or received over the network 726 via the modem 722, such that the network 726 includes computer-readable medium 732.

While the computer-readable medium 732 is shown in an exemplary embodiment to be a single medium, the term "computer-readable medium" should be taken to include a single medium or multiple media (e.g., a centralized or distributed database, and/or associated caches and servers) that stores the one or more sets of instructions. The term "computer-readable medium" shall also be taken to include any medium that is capable of storing, encoding, or carrying a set of instructions for execution by the processing device and that causes the processing device to perform any one or more of the methodologies of the embodiments disclosed herein. The term "computer-readable medium" shall accordingly be taken to include, but not be limited to, solid-state memories, optical medium, and magnetic medium.

The processor 702 in the processor-based system 700 may include, in any of the devices therein, an exemplary memory array system including features of a bit cell column circuit including a read control circuit configured to selectively couple a first read bit line to a column read circuit in a read operation to one of a first plurality of memory bit cell circuits, as illustrated in FIGS. 4A, and 4B.

The embodiments disclosed herein include various steps. The steps of the embodiments disclosed herein may be formed by hardware components or may be embodied in machine-executable instructions, which may be used to cause a general-purpose or special-purpose processor programmed with the instructions to perform the steps. Alternatively, the steps may be performed by a combination of hardware and software.

The embodiments disclosed herein may be provided as a computer program product, or software, that may include a machine-readable medium (or computer-readable medium) having stored thereon instructions, which may be used to program a computer system (or other electronic devices) to perform a process according to the embodiments disclosed herein. A machine-readable medium includes any mechanism for storing or transmitting information in a form readable by a machine (e.g., a computer). For example, a machine-readable medium includes: a machine-readable storage medium (e.g., ROM, random access memory ("RAM"), a magnetic disk storage medium, an optical storage medium, flash memory devices, etc.); and the like.

Unless specifically stated otherwise and as apparent from the previous discussion, it is appreciated that throughout the description, discussions utilizing terms such as "processing," "computing," "determining," "displaying," or the like, refer to the action and processes of a computer system, or similar electronic computing device, that manipulates and transforms data and memories represented as physical (electronic) quantities within the computer system's registers into other data similarly represented as physical quantities within the computer system memories or registers or other such information storage, transmission, or display devices.

The algorithms and displays presented herein are not inherently related to any particular computer or other apparatus. Various systems may be used with programs in accordance with the teachings herein, or it may prove convenient to construct more specialized apparatuses to perform the required method steps. The required structure for a variety of these systems will appear from the description above. In addition, the embodiments described herein are not described with reference to any particular programming language. It will be appreciated that a variety of programming languages may be used to implement the teachings of the embodiments as described herein.

Those of skill in the art will further appreciate that the various illustrative logical blocks, modules, circuits, and algorithms described in connection with the embodiments disclosed herein may be implemented as electronic hardware, instructions stored in memory or in another computer-readable medium and executed by a processor or other processing device, or combinations of both. The components of the distributed antenna systems described herein may be employed in any circuit, hardware component, integrated circuit (IC), or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends on the particular application, design choices, and/or design constraints imposed on the overall system. Skilled artisans may implement the described functionality in varying ways for each particular application, but such implementation decisions should not be interpreted as causing a departure from the scope of the present embodiments.

The various illustrative logical blocks, modules, and circuits described in connection with the embodiments disclosed herein may be implemented or performed with a processor, a Digital Signal Processor (DSP), an Application Specific Integrated Circuit (ASIC), a Field Programmable Gate Array (FPGA), or other programmable logic device, a discrete gate or transistor logic, discrete hardware components, or any combination thereof designed to perform the functions described herein. Furthermore, a controller may be a processor. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The embodiments disclosed herein may be embodied in hardware and in instructions that are stored in hardware, and may reside, for example, in RAM, flash memory, ROM, Electrically Programmable ROM (EPROM), Electrically Erasable Programmable ROM (EEPROM), registers, a hard disk, a removable disk, a CD-ROM, or any other form of computer-readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary embodiments herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary embodiments may be combined. Those of skill in the art will also understand that information and signals may be represented using any of a variety of technologies and techniques. For example, data, instructions, commands, information, signals, bits, symbols, and chips, that may be references throughout the above description, may be represented by voltages, currents, electromagnetic waves, magnetic fields, or particles, optical fields or particles, or any combination thereof.

Unless otherwise expressly stated, it is in no way intended that any method set forth herein be construed as requiring that its steps be performed in a specific order. Accordingly, where a method claim does not actually recite an order to be followed by its steps, or it is not otherwise specifically stated in the claims or descriptions that the steps are to be limited to a specific order, it is in no way intended that any particular order be inferred.

It will be apparent to those skilled in the art that various modifications and variations can be made without departing from the spirit or scope of the invention. Since modifications, combinations, sub-combinations and variations of the disclosed embodiments incorporating the spirit and substance of the invention may occur to persons skilled in the art, the invention should be construed to include everything within the scope of the appended claims and their equivalents.

What is claimed is:

1. A memory system comprising:
at least one bit cell column circuit each comprising:
a plurality of memory bit cell circuits;
a read bit line coupled to a first plurality of memory bit cell circuits of the plurality of memory bit cell circuits in a bit cell column circuit among the at least one bit cell column circuit; and
a column read circuit comprising:
an evaluation output line;
a pre-charge circuit configured to:
pre-charge the evaluation output line in an idle stage and in a pre-charge stage of a read operation, comprising couple the evaluation output line to a supply voltage rail in response to receiving a pre-charge signal in an active state from the read control circuit; and
a float control circuit coupled between the read bit line and the evaluation output line, the float control circuit configured to:
couple the read bit line to the evaluation output line in the pre-charge stage and in an evaluation stage of the read operation; and
decouple the read bit line from the evaluation output line in the idle stage;
wherein the column read circuit is configured to evaluate a stored logic state of a selected one of the first plurality of memory bit cell circuits on the evaluation output line in the evaluation stage; and
a read control circuit coupled to the float control circuit, the read control circuit configured to:
cause the float control circuit to couple the evaluation output line to the read bit line in response to the pre-charge stage and in response to the evaluation stage of the read operation, comprising generate a float control signal in an active state to turn on the float control circuit in response to receiving the indication of the pre-charge stage of a read operation and in response to receiving the indication of the evaluation stage of the read operation;
cause the float control circuit to decouple the evaluation output line from the read bit line in response to the idle stage, further comprising generate the float control signal in an inactive state to turn off the float control circuit in response to receiving the indication of the idle stage;
generate the pre-charge signal in the active state in response to receiving an indication of the idle stage and in response to receiving an indication of the pre-charge stage of the read operation;
generate the pre-charge signal in an inactive state in response to receiving an indication of the evaluation stage of the read operation.

2. The memory system of claim 1, wherein the pre-charge circuit configured to couple the evaluation output line to the supply voltage rail comprises the pre-charge circuit configured to:
charge the evaluation output line to a first pre-charged state comprising a first voltage; and
charge the read bit line to a second pre-charged state comprising a second voltage based on the evaluation output line charged to the first voltage, the second voltage lower than the first voltage.

3. The memory system of claim 2, each of the plurality of memory bit cell circuits further comprising:
a data node configured to store a logic state of data; and
a read port circuit comprising a read port output coupled to the read bit line, the read port circuit configured to, in response to receiving a read word line (RWL) signal in an active state:
couple the read bit line to a ground voltage rail to discharge the evaluation output line to a discharged state in response to the logic state of the data stored on a first data node comprising a first logic state; and
decouple the read bit line from the ground voltage rail to keep the evaluation output line in the first pre-charged state in response to the logic state of the data stored on the first data node comprising a second logic state.

4. The memory system of claim 3, the column read circuit further comprising a column output circuit configured to generate a column output signal based on an evaluation output signal on the evaluation output line, the evaluation output signal based on whether the evaluation output line is in the first pre-charged state or the discharged state.

5. The memory system of claim 4, the column read circuit further comprising a keep-up circuit coupled to the evaluation output line, the keep-up circuit configured to, in the evaluation stage:
couple the evaluation output line to the supply voltage rail in response to the column output signal indicating the evaluation output line comprises the first pre-charged state; and
decouple the evaluation output line from the supply voltage rail in response to the column output signal indicating the evaluation output line comprises the discharged state.

6. The memory system of claim 5, wherein:
the read bit line comprises a first read bit line;
the float control circuit comprises a first float control circuit;
the memory system further comprises a second read bit line coupled to a second plurality of memory bit cell circuits of the plurality of memory bit cell circuits in the bit cell column circuit;
the column read circuit further comprises a second float control circuit; and
the read control circuit configured to cause the float control circuit to couple the evaluation output line to the read bit line in response to the pre-charge stage and in response to the evaluation stage further comprises the read control circuit being further configured to:
in response to an indication that a read operation is directed to one of the first plurality of memory bit cell circuits, cause the column read circuit to couple the first read bit line to the evaluation output line and decouple the second read bit line from the evaluation output line in the pre-charge stage and in the evaluation stage of the read operation;
in response to an indication that a read operation is directed to a memory bit cell among the second plurality of memory bit cell circuits, cause the column read circuit to couple the second read bit line to the evaluation output line and decouple the first read bit line from the evaluation output line in the second pre-charged state and in the evaluation stage of the read operation; and
decouple the first read bit line and the second read bit line from the evaluation output line in the idle stage.

7. The memory system of claim 6, wherein:
in response to coupling the first read bit line to the evaluation output line, the column output circuit generates the column output signal based on the first read bit line comprising one of the discharged state and the second pre-charged state; and
in response to coupling the second read bit line to the evaluation output line, the column output circuit generates the column output signal based on the second read bit line comprising one of the discharged state and the second pre-charged state.

8. The memory system of claim 1, wherein:
the read control circuit is further configured to:
receive an indication of the pre-charge stage of the read operation comprising receiving a transition of a read enable signal to an active state;
receive an indication of the evaluation stage of the read operation comprising the read enable signal comprising the active state and receiving a transition of a system clock signal to a first clock state; and
receive an indication of the idle stage comprising the read enable signal comprising an inactive state and receiving a transition of the system clock signal to a second clock state.

9. A memory system comprising:
at least one bit cell column circuit each comprising:
a plurality of memory bit cell circuits;
a read bit line coupled to a first plurality of memory bit cell circuits of the plurality of memory bit cell circuits in a bit cell column circuit among the at least one bit cell column circuit; and
a column read circuit comprising:
an evaluation output line;
a pre-charge circuit configured to pre-charge the evaluation output line in an idle stage and in a pre-charge stage of a read operation, comprising couple the evaluation output line to a supply voltage rail in response to receiving a pre-charge signal in an active state from the read control circuit;
a float control circuit coupled between the read bit line and the evaluation output line, the float control circuit configured to:
couple the read bit line to the evaluation output line in the pre-charge stage and an evaluation stage of the read operation; and
decouple the read bit line from the evaluation output line in an idle stage; and
a column output circuit coupled to the evaluation output line, the column output circuit configured to generate a column output signal based on an evaluation output signal, the column output circuit comprising an inverter circuit configured to generate the column output signal comprising a logic state complementary to a logic state of the evaluation output line;
wherein the column read circuit is configured to evaluate a stored logic state of a selected one of the first plurality of memory bit cell circuits on the evaluation output line in the evaluation stage; and
a read control circuit coupled to the float control circuit, the read control circuit configured to:
cause the float control circuit to couple the evaluation output line to the read bit line in response to the pre-charge stage and in response to the evaluation stage of the read operation, comprising generate a float control signal in an active state to turn on the float control circuit in response to receiving the indication of the pre-charge stage of a read operation and in response to receiving the indication of the evaluation stage of the read operation;
cause the float control circuit to decouple the evaluation output line from the read bit line in response to the idle stage, further comprising generate the float control signal in an inactive state to turn off the float control circuit in response to receiving the indication of the idle stage;
generate the pre-charge signal in the active state in response to receiving an indication of the idle stage and in response to receiving an indication of the pre-charge stage of the read operation; and
generate the pre-charge signal in an inactive state in response to receiving an indication of the evaluation stage of the read operation.

10. The memory system of claim 9, further comprising:
a read control circuit coupled to the float control circuit and the pre-charge circuit, the read control circuit configured to control the float control circuit and the pre-charge circuit.

11. The memory system of claim 9, wherein the pre-charge circuit configured to couple the evaluation output line to the supply voltage rail comprises the pre-charge circuit being further configured to:
charge the evaluation output line to a first pre-charged state comprising a first voltage; and
charge the read bit line to a second pre-charged state comprising a second voltage based on the evaluation output line charged to the first voltage, the second voltage lower than the first voltage.

12. The memory system of claim 11, each of the plurality of memory bit cell circuits further comprising:
a data node configured to store a logic state of data; and
a read port circuit comprising a read port output coupled to the read bit line, the read port circuit configured to, in response to receiving a read word line (RWL) signal in an active state:
couple the read bit line to a ground voltage rail to discharge the evaluation output line to a discharged state in response to the logic state of the data stored on a first data node comprising a first logic state; and
decouple the read bit line from the ground voltage rail to keep the evaluation output line in the first pre-charged state in response to the logic state of the data stored on the first data node comprising a second logic state.

13. The memory system of claim 12, the column read circuit further comprising the column output circuit configured to generate the column output signal based on the evaluation output signal on the evaluation output line, the evaluation output signal based on whether the evaluation output line is in the first pre-charged state or the discharged state.

14. The memory system of claim 13, the column read circuit further comprising a keep-up circuit coupled to the evaluation output line, the keep-up circuit configured to:
couple the evaluation output line to the supply voltage rail in response to the column output signal indicating the evaluation output line comprises the first pre-charged state; and
decouple the evaluation output line from the supply voltage rail in response to the column output signal indicating the evaluation output line comprises the discharged state.

15. The memory system of claim 14, wherein:
the read bit line comprises a first read bit line;
the float control circuit comprises a first float control circuit;
the memory system further comprises a second read bit line coupled to a second plurality of memory bit cell circuits of the plurality of memory bit cell circuits in the bit cell column circuit;
the column read circuit further comprises a second float control circuit; and
the read control circuit configured to cause the float control circuit to couple the evaluation output line to the read bit line in the second pre-charged state and in the evaluation stage further comprises the read control circuit being further configured to:
  in response to an indication that a read operation is directed a memory bit cell among the first plurality of memory bit cell circuits, couple the first read bit line to the evaluation output line and decouple the second read bit line from the evaluation output line in the second pre-charged state and in the evaluation stage of the read operation;
  in response to an indication that a read operation is directed to a memory bit cell among the second plurality of memory bit cell circuits, couple the second read bit line to the evaluation output line and decouple the first read bit line from the evaluation output line in the second pre-charged state and in the evaluation stage of the read operation; and
  decouple the first read bit line and the second read bit line from the evaluation output line in the idle stage.

16. The memory system of claim 15, wherein:
in response to coupling the first read bit line to the evaluation output line, the column output circuit generates the evaluation output signal based on the first read bit line comprising one of the discharged state and the second pre-charged state; and
in response to coupling the second read bit line to the evaluation output line, the column output circuit generates the evaluation output signal based on the second read bit line comprising one of the discharged state and the second pre-charged state.

17. A method of a memory system, the method comprising:
  in a bit cell column circuit comprising a plurality of memory bit cell circuits, a read bit line coupled to a first plurality of memory bit cell circuits of the plurality of memory bit cell circuits in a bit cell column circuit among the at least one bit cell column circuit, a column read circuit, and a read control circuit:
    pre-charging, by a pre-charge circuit, an evaluation output line in an idle stage and in a pre-charge stage of a read operation, the pre-charging comprising coupling the evaluation output line to a supply voltage rail in response to receiving a pre-charge signal in an active state from the read control circuit;
    coupling, by a float control circuit coupled between the read bit line and the evaluation output line, the read bit line to the evaluation output line in the pre-charge stage and in an evaluation stage of the read operation; and
    decoupling, by the float control circuit, the read bit line from the evaluation output line in the idle stage,
    evaluating, by the column read circuit, a stored logic state of a selected one of the first plurality of memory bit cell circuits on the evaluation output line in the evaluation stage;
    causing, by the read control circuit, the float control circuit to:
      couple the evaluation output line to the read bit line in response to the pre-charge stage and in response to the evaluation stage of the read operation, comprising generating a float control signal in an active state to turn on the float control circuit in response to receiving the indication of the pre-charge stage of a read operation and in response to receiving the indication of the evaluation stage of the read operation; and
      decouple the evaluation output line from the read bit line in response to the idle stage, further comprising generate the float control signal in an inactive state to turn off the float control circuit in response to receiving the indication of the idle stage;
    generating, by the read control circuit:
      the pre-charge signal in the active state in response to receiving an indication of the idle stage and in response to receiving an indication of the pre-charge stage of the read operation; and
      the pre-charge signal in an inactive state in response to receiving an indication of the evaluation stage of the read operation.

* * * * *